United States Patent
Dittmar et al.

(10) Patent No.: US 9,627,445 B2
(45) Date of Patent: Apr. 18, 2017

(54) OPTOELECTRONIC COMPONENT AND A METHOD FOR MANUFACTURING AN OPTOELECTRONIC COMPONENT

(71) Applicant: Infineon Technologies Dresden GmbH, Dresden (DE)

(72) Inventors: Ludwig Dittmar, Dresden (DE); Dirk Meinhold, Dresden (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 58 days.

(21) Appl. No.: 14/097,291

(22) Filed: Dec. 5, 2013

(65) Prior Publication Data

US 2015/0162385 A1    Jun. 11, 2015

(51) Int. Cl.
  H01L 33/36    (2010.01)
  H01L 27/32    (2006.01)
  H01L 27/15    (2006.01)
  H01L 33/62    (2010.01)
  H01L 51/52    (2006.01)
  (Continued)

(52) U.S. Cl.
  CPC ............ *H01L 27/32* (2013.01); *H01L 24/05* (2013.01); *H01L 27/15* (2013.01); *H01L 33/62* (2013.01); *H01L 51/52* (2013.01); *H01L 51/5203* (2013.01); *H01L 51/5218* (2013.01); *H01L 51/56* (2013.01); *H01L 27/3276* (2013.01); *H01L 51/5234* (2013.01); *H01L 2224/04042* (2013.01); *H01L 2224/48463* (2013.01); *H01L 2924/12041* (2013.01); *H01L 2924/12042* (2013.01); *H01L 2924/12043* (2013.01); *H01L 2924/12044* (2013.01); *H01L 2924/13055* (2013.01); *H01L 2924/13091* (2013.01); *H01L 2933/0066* (2013.01)

(58) Field of Classification Search
  None
  See application file for complete search history.

(56) References Cited

U.S. PATENT DOCUMENTS 5,858,814 A * 1/1999 Goossen et al. ............... 438/107
6,005,262 A * 12/1999 Cunningham et al. .......... 257/84
6,583,445 B1 * 6/2003 Reedy et al. .................... 257/82
(Continued)

OTHER PUBLICATIONS

Haigh et. al. "Visible light communications using organic light emitting diodes", pp. 148-154, IEEE Communications magazine, Aug. 2013, IEEE.*
(Continued)

*Primary Examiner* — Andy Huynh
*Assistant Examiner* — Sitaramarao S Yechuri
(74) *Attorney, Agent, or Firm* — Viering, Jentschura & Partner mbB

(57) ABSTRACT

Various embodiments relate to an optoelectronic component including: an electronic circuit structure including an electronic circuit and a metallization structure disposed over the electronic circuit, the metallization structure including one or more contact pads electrically connected to the electronic circuit; and an optoelectronic structure disposed over the metallization structure, the optoelectronic structure including at least one electrode structure being in direct contact with the one or more contact pads, wherein the electrode structure includes an electroless plated electrically conductive material.

26 Claims, 11 Drawing Sheets

(51) Int. Cl.
*H01L 51/56* (2006.01)
*H01L 23/00* (2006.01)

(56) References Cited

U.S. PATENT DOCUMENTS

| | | | |
|---|---|---|---|
| 2004/0115906 A1* | 6/2004 | Makita | H01L 21/2022 438/486 |
| 2005/0145839 A1* | 7/2005 | Yamamoto et al. | 257/40 |
| 2005/0243886 A1* | 11/2005 | Wang | H01S 5/18377 372/98 |
| 2005/0258513 A1* | 11/2005 | Eshun | 257/536 |
| 2007/0194450 A1* | 8/2007 | Tyberg | H01L 23/5226 257/751 |
| 2007/0228543 A1* | 10/2007 | Walter | H01L 24/13 257/686 |
| 2008/0182368 A1* | 7/2008 | Kunii | H01L 27/1214 438/158 |
| 2010/0025666 A1* | 2/2010 | Hakii | B82Y 10/00 257/40 |
| 2010/0321640 A1* | 12/2010 | Yeh et al. | 353/31 |
| 2011/0062481 A1* | 3/2011 | Oyamada | B82Y 20/00 257/98 |
| 2011/0121346 A1* | 5/2011 | Yamada | H01L 51/5234 257/98 |
| 2011/0189848 A1* | 8/2011 | Ewert | C25D 3/32 438/612 |
| 2012/0163811 A1* | 6/2012 | Doany | H04B 10/40 398/41 |
| 2013/0221464 A1* | 8/2013 | Fogel | H01L 31/022466 257/432 |

OTHER PUBLICATIONS

Driggers et. al. "Encyclopedia of Optical engineering: Pho-Z, pp. 2049-3050", pp. 2354, 2355, CRC Press 2003, Marcel Dekker, Inc.*

* cited by examiner

FIG. 6

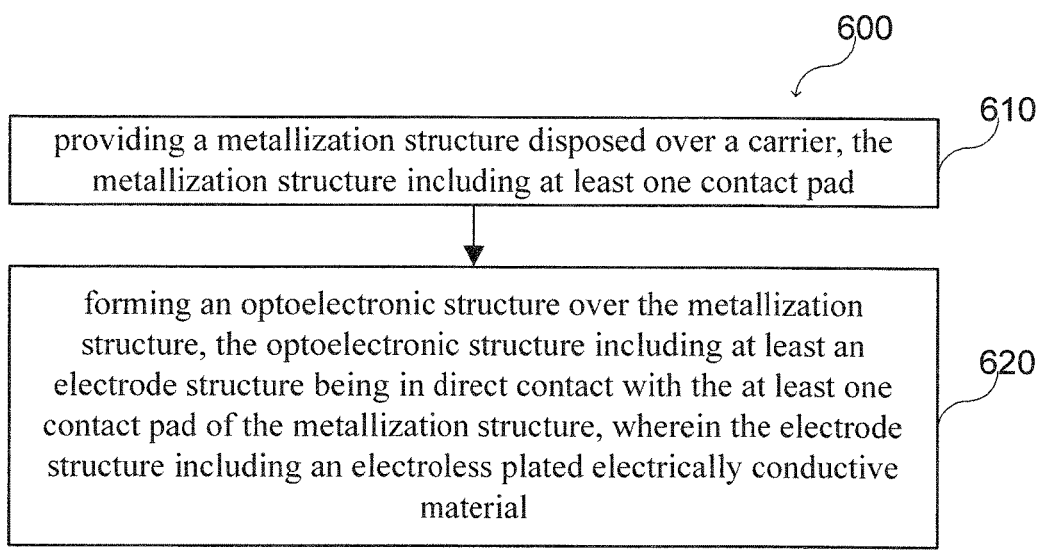

600
- 610: providing a metallization structure disposed over a carrier, the metallization structure including at least one contact pad
- 620: forming an optoelectronic structure over the metallization structure, the optoelectronic structure including at least an electrode structure being in direct contact with the at least one contact pad of the metallization structure, wherein the electrode structure including an electroless plated electrically conductive material

FIG. 7

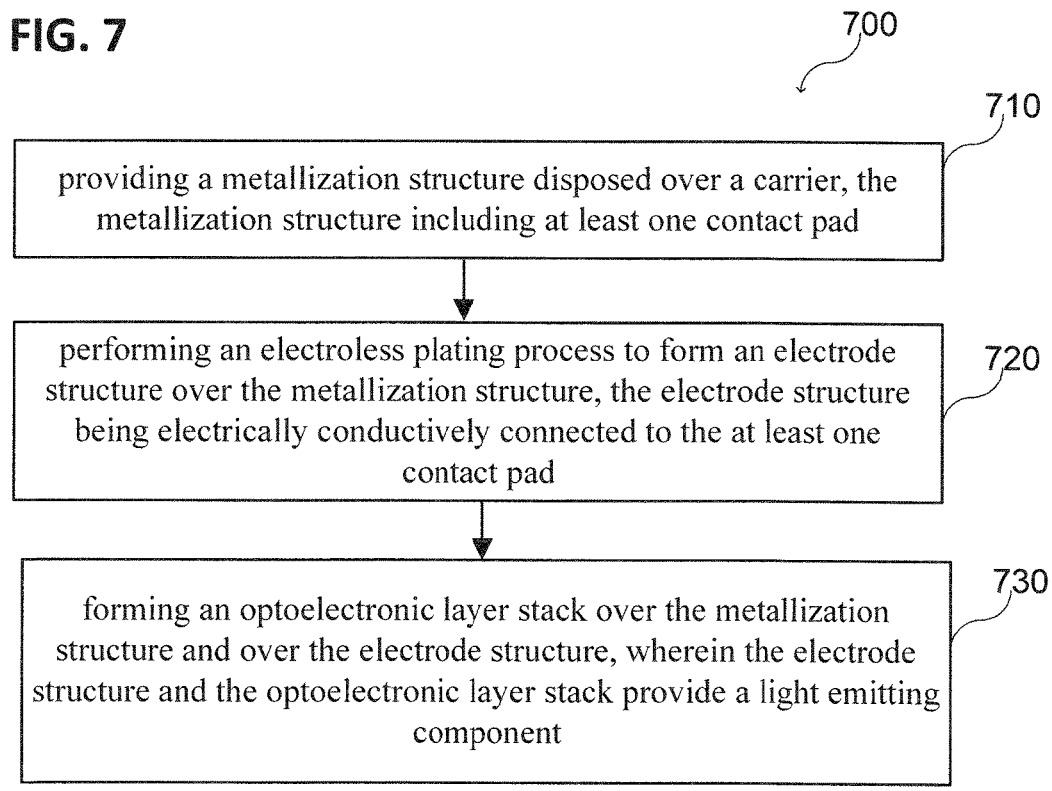

700
- 710: providing a metallization structure disposed over a carrier, the metallization structure including at least one contact pad
- 720: performing an electroless plating process to form an electrode structure over the metallization structure, the electrode structure being electrically conductively connected to the at least one contact pad
- 730: forming an optoelectronic layer stack over the metallization structure and over the electrode structure, wherein the electrode structure and the optoelectronic layer stack provide a light emitting component

OPTOELECTRONIC COMPONENT AND A METHOD FOR MANUFACTURING AN OPTOELECTRONIC COMPONENT

TECHNICAL FIELD

Various embodiments relate generally to an optoelectronic component and to a method for manufacturing an optoelectronic component.

BACKGROUND

In general, an optoelectronic component, as for example a light emitting diode (LED) or an organic light emitting diode (OLED) may be manufactured on a carrier, wherein the carrier may be or may not be transparent to the specific wavelength of the light being radiated from the diode depending on the type of the light emitting diode, e.g. the diode may be a top emitting diode, a bottom emitting diode, or a diode emitting light into various directions. A light emitting diode may include at least two electrodes, an anode and a cathode, being separated by an electroluminescent material (e.g. by a so-called emitter layer or emitter structure) such that light may be emitted from the light emitting diode in response to an electric current or to an electrical field being applied between the at least two electrodes. The electrodes may include an electrically conductive material allowing a charge carrier transport into the electroluminescent material. The light may be emitted from the electroluminescent material due to recombination of electrons and holes being for example injected into the electroluminescent material.

SUMMARY

Various embodiments relate to an optoelectronic component including: an electronic circuit structure including an electronic circuit and a metallization structure disposed over the electronic circuit, the metallization structure including one or more contact pads electrically connected to the electronic circuit; and an optoelectronic structure disposed over the metallization structure, the optoelectronic structure including at least one electrode structure being in direct contact with the one or more contact pads, wherein the electrode structure includes an electroless plated electrically conductive material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 6 and 7 respectively show a schematic flow diagram of a method for manufacturing an optoelectronic component, according to various embodiments.

DESCRIPTION

Figure 1A:
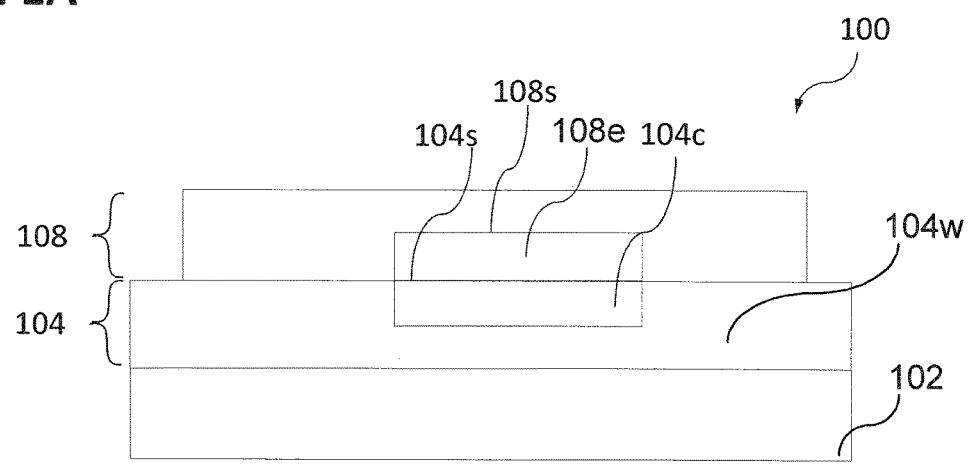
FIGS. 1A to 1C respectively show an optoelectronic component in a schematic cross sectional view or side view, according to various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a carrier) or "laterally" surrounding, may be used herein to mean an extension along a direction parallel to a surface of a carrier. That means that a surface of a carrier (e.g. a surface of a substrate, or a surface of a wafer) may serve as reference, commonly referred to as the main processing surface of a wafer (or the main processing surface of another type of carrier). Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier).

In general, semiconductor industry processes have been developed to provide high quality layers (also referred to as thin films or thin layers), wherein the layers may be formed for example having a desired (predefined) thickness and/or morphology. Further, the layer may be provided realizing a large range of desired (predefined) properties, e.g. edge-covering behavior, electronic properties, optical properties, and/or chemical properties. Thin film technology or layering technology may enable the manufacturing of an electronic device, for example an optoelectronic device, which may be formed on a wafer or a carrier using processes of semiconductor industry. However, there may arise problems in growing for example smooth layers of various materials or providing smooth thin layers, since the layer growth mechanisms may cause a certain surface roughness depending on the materials to be grown, the material of the substrate or carrier, and the growth conditions (or the specific layering process being applied).

In general, there may be a large number of applicable deposition processes or layering processes, e.g. physical vapor deposition processes (PVD), chemical vapor deposition processes (CVD), which may be used to form (grow or deposit) a layer or a thin film of a specific material. Thereby, metals, metallic materials, and organic materials may for example grow in a so-called island-growth (Volmer-Weber growth) or a mixed growth including island growth (Stranski-Krastanov growth). For layering processes providing or including an island-growth of the deposited material, the surface roughness of the layer may be large compared to a layer by layer growth (Frank-van der Merwe growth). Further the island growth may cause a different microstructure and/or morphology of the deposited layer such that the physical properties of the grown layer may differ from a layer formed by using a layer by layer growth.

Therefore, it may be challenging to grow a smooth layer or thin film on a carrier. However, the morphology and the microstructure of a thin film or a layer may influence and determine the physical (optical and electrical) properties of the thin film or of the layer. The control of the morphology and the microstructure during thin film growth may be beneficial in semiconductor processing, e.g. for layering processes, patterning processes, and the like. A substantial part of the morphology of a grown (formed or deposited) layer may be reflected in the surface roughness of the layer, wherein another aspect of the thin film growth may address the microstructure of the layer (e.g. grain size, grain boundaries, cracks, dislocations, defects, strain and the like). The surface roughness of a layer may be quantified by the vertical deviations of a real surface from the respective shape of the corresponding ideal form of the surface. The Roughness may be quantified as RMS-roughness (root-mean-squared-roughness), wherein the vertical deviations of the height (or thickness) of the thin film or layer may be correlated with the arithmetic value of the height or thickness.

In general, it may be difficult and/or expensive to control the surface roughness of the layers during manufacturing. On the one hand, decreasing the surface roughness may for example increase the manufacturing costs of the layers or devices including the smooth layers. On the other hand, decreasing the surface roughness may enhance the electrical and optical properties of the thin film or layer. Further, decreasing the surface roughness of a layer may enable the growth of smooth layers on top of the layer, such that the physical and chemical properties of a whole layer stack or a device may be improved, using a smoother layer as a primary layer. As described herein, a smoother layer or a smooth layer may have a smaller roughness (e.g. RMS roughness) compared to another layer or other layers formed by commonly used techniques.

In general, an electronic circuit (or in analogy an integrated circuit) may include a metallization structure, a so-called metallization (e.g. a single-level metallization including a single wiring layer or a multi-level metallization including a plurality of wiring layers being arranged in a layer stack), wherein the metallization structure may for example provide the electrical connection between electronic circuit structures for enabling the functioning of the electronic circuit and/or wherein the metallization structure may for example provide an access to the electronic circuit, e.g. to electrically connect the electronic circuit to a peripheral device or component. A wiring layer may include a patterned dielectric layer or a dielectric layer structure including an electrically insulating material (e.g. a dielectric material), wherein the dielectric layer or the dielectric layer structure may be configured to provide at least one of recesses, voids, holes, through holes, and the like, being filled with an electrically conductive material to provide the electrical wiring of the wiring layer; the electrical wiring may for example include one or more metal lines, one or more vias, and one or more contact structures. A contact structure may for example include at least one contact pad, being exposed at an upper surface of the wiring layer such that an access to the electrical wiring may be provided. In general, the metallization structure of an electronic circuit may be optimized under the aspects of cost efficiency, processability, durability and the like.

However, forming a layer (or thin film) or layer structure (or thin film structure) over a readily processed metallization, wherein the layer or layer structure may have the respectively desired chemical and physical properties, may be difficult, since a commonly used metallization may not provide the optimal basis for a layer or a layer structure. Various embodiments described herein may base on the realization, that an enhanced electrode structure for an optoelectronic structure may be formed over a metallization via an electroless deposition process, e.g. including silver and/or gold.

According to various embodiments, an optoelectronic structure may be formed for example over a metallization of an electronic circuit, wherein the optoelectronic structure may include at least one electrode structure being in contact or in direct contact (e.g. electrically conductively connected) with the electrical wiring of the metallization, e.g. with at least one contact pad (e.g. one or more contact pads) of the metallization or with the contact structure of the metallization. Since the optical properties and/or the electrical properties of the optoelectronic structure may be influenced by the physical and/or chemical properties of the at least one electrode structure (e.g. by the conductivity, the band structure, the optical properties, the reflectivity, the transmittance, the morphology, the surface morphology, the surface and interfacial physics, and the like) it may be desired to provide an optimal electrode structure for the respective optoelectronic structure over the metallization.

According to various embodiments, the same aspects described herein may also apply for an optoelectronic structure to be formed over a metallization of a carrier, e.g. over a metallization of a glass carrier, over a metallization of a metal carrier, or over a metallization of any other type of carrier, e.g. over a metallization of a semiconductor carrier.

According to various embodiments, a metallization may be provided over a carrier or over an electronic circuit, the metallization may include one or more contact pads exposed at an upper surface of the metallization, the one or more contact pads may include for example copper and/or aluminum, e.g. the metallization may be formed in copper-etch technology, aluminum-etch technology, or in a so-called dual damascene technique including copper and/or aluminum.

Since aluminum may be commonly used for providing electrodes of optoelectronic structures, commonly applied approaches for forming an optoelectronic structure over a metallization include providing an aluminum based electrode structure over the metallization. Illustratively, various embodiments described herein may be based on the realization, that firstly, it may be difficult to grow a smooth and dense layer of aluminum having the desired physical properties (e.g. reflectivity) over a metallization, and secondly, that other materials like silver and gold may have more suitable optical properties (e.g. reflectivity in a desired color (wavelength range) of the light) for providing an electrode of an optoelectronic device, e.g. for providing an electrode of an light emitting device (LED) or an organic light emitting device (OLED).

According to various embodiments, it was recognized, that forming an electrode including silver and/or gold by applying an electroless deposition process may allow forming an electrode structure over a metallization including copper and/or aluminum, wherein the electrode structure has superior optical properties (e.g. resulting from improved physical properties like a reduced surface roughness or a dense and homogeneous microstructure).

According to various embodiments, the electrode provided herein may have a high reflectivity referring to the optical spectrum of the electromagnetic radiation, e.g. due to a low surface roughness, a high electrical conductivity and a high thermal conductivity, e.g. due to the dense microstructure. Further, according to various embodiments, the low surface roughness may enable the growth of additional layers on top of the electrode with a low surface roughness and an advantageous microstructure. According to various embodiments, the enhanced physical properties may result from the materials being used as electrode material, the materials being used as contact pads below the electrode, and/or the manufacturing process, e.g. the electroless deposition or electroless plating, as described in the following. According to various embodiments, the electrode or the electrode structure described herein may include for example silver, e.g. a silver layer having a thickness smaller than about 50 nm having for example a surface roughness (RMS) smaller than about 3 nm. According to various embodiments, the electrode or the electrode structure described herein may include for example gold, e.g. a gold layer having a thickness smaller than about 50 nm having for example a surface roughness (RMS) smaller than about 3 nm.

According to various embodiments, the electrode material forming the electrode structure of the optoelectronic structure may be electroless plated directly on the exposed surface of the copper and/or aluminum contacts of the metallization structure. In other words, a copper and/or aluminum based metallization structure may be used as basis for forming the electrode structure of the optoelectronic structure. The surface of the metallization structure being in direct contact with the electrode structure may be planarised. Applying an electroless deposition of silver and/or gold over the contact pads of the metallization may provide, firstly, a high quality interface and/or a high adhesion between the electrode structure (e.g. including silver) and the metallization structure (e.g. including copper and/or aluminum contact pads), and secondly, a smooth and dense upper surface of the electrode structure being exposed for a further processing, e.g. for forming an optoelectronic layer stack over the electrode structure providing an optoelectronic structure. Due to the high quality of the electrode structure, the electrode may provide a basis for the further processing and the material of the electrode structure (or the material of the electrode) may provide an optimal reflectance in the desired wavelength range (see FIG. 8 and FIG. 9), the optoelectronic structure may have an enhanced efficiency, an enhanced lifetime, and/or properties being close to the desired (optimal) properties.

According to various embodiments, an optoelectronic component (e.g. an optoelectronic device or a part of an optoelectronic device) and a method for manufacturing an optoelectronic component (or processing a carrier to provide an optoelectronic component) may be provided herein, wherein the optoelectronic component may be formed in semiconductor technology.

Since there may be many individual processes used in semiconductor processing (e.g. during the manufacture of an optoelectronic component, during the manufacture of a metallization structure, and/or during the manufacture of an optoelectronic structure or an optoelectronic layer stack, e.g. during front-end-of-line processing of a carrier or of a wafer and back-end-of-line processing of a carrier or of a wafer), usually carried out in sequence, several basic manufacturing techniques may be used at least once in the overall manufacturing process. The following description of basic techniques should be understood as illustrating examples, which techniques may be included in the processes described herein or which techniques may be used to provide a contact pad structure as described herein. The exemplarily described basic techniques may be not necessarily need to be construed as preferred or advantageous over other techniques or methods, since they only serve to illustrate how one or more embodiments of the invention may be practiced. For sake of brevity, the illustration of exemplarily described basic techniques may be only a short overview and should not be considered as exhaustive specification.

According to various embodiments, forming a layer (e.g. depositing a layer, depositing a material, and/or applying a layering process) as described herein may also include forming a layer, wherein the layer may include various sub-layers, whereby different sub-layers may include different materials respectively. In other words, various different sub-layers may be included in a layer, or various different regions may be included in a deposited layer and/or in a deposited material.

According to various embodiments, at least one layering or at least one layering process may be used in a method for manufacturing an optoelectronic component or during forming a metallization structure (a dielectric layer or a wiring layer), during forming an electronic circuit, or during forming an optoelectronic structure, as described herein. In a layering process, a layer (also generally referred to as film or thin film) may be deposited over a surface (e.g. over a carrier, over a wafer, over a substrate, over another layer, over a plurality of structure elements, and the like) using deposition techniques which may include chemical vapor deposition (CVD, or a CVD process) and/or physical vapor deposition (PVD, or a PVD process), according to various embodiments. The thickness of a deposited layer may be in the range of a few nanometers up to several micrometers depending on its specific function. The thickness of a deposited layer may be regarded as the spatial extension of the deposited layer along its growth direction. Thin layers in the range of a few nanometers, e.g. having a layer thickness smaller than 50 nm, may be formed using an atomic layer deposition (ALD). A conformal layer, e.g. covering the sidewalls of a structure element or covering vertical sidewalls, may be formed using an atomic layer deposition (ALD) or another suitable conformal deposition process, as for example low pressure chemical vapor deposition (LP-CVD).

According to various embodiments, a deposited (formed or provided) layer may include at least one of an electrically insulating material, an electrically semiconducting material, and/or an electrically conductive material, depending on the respective specific function of the deposited layer. According to various embodiments, electrically conductive materials, as for example aluminium, aluminium-silicon alloys, aluminium-copper alloys, copper, nichrome (an alloy of nickel, chromium, and/or iron), tungsten, titanium, titanium nitride, molybdenum, platinum, gold, carbon (graphite), or the like, may be deposited using a CVD process or a PVD process. According to various embodiments, semiconducting materials, as for example silicon (e.g. silicon, polycrystalline silicon (also referred to as polysilicon), or amorphous silicon), germanium, a semiconductor compound material such as gallium arsenide (GaAs), indium phosphide (InP), or indium gallium arsenide (InGaAs) may be deposited using a CVD process. Insulating materials, as for example silicon oxide, silicon nitride, silicon oxynitride, metal oxides (e.g. aluminum oxide), organic compounds, polymers, (or the like) may be deposited using a CVD process or a PVD process. According to various embodiments, modifications of these processes may be used as described in the following.

According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDPCVD), remote plasma enhanced CVD (RPECVD), atomic layer CVD (ALCVD), vapor phase epitaxy (VPE), metal organic CVD (MOCVD), hybrid physical CVD (HPCVD), and the like. According to various embodiments, silicon, polysilicon, amorphous silicon, silicon dioxide, silicon nitride, and the like may be deposited using LPCVD or ALCVD. According to various embodiments, for example platinum, palladium, gold, titanium nitride, titanium oxide, may be deposited using atomic layer deposition (ALD or ALCVD).

According to various embodiments, a physical vapor deposition process may include a variety of modifications, as for example magnetron sputtering, ion-beam sputtering (IBS), reactive sputtering, high-power impulse magnetron sputtering (HIPIMS), vacuum evaporation, molecular beam epitaxy (MBE), and the like.

According to various embodiments, a layering process may further include thermal oxidation (also referred to as thermal oxidation process). According to various embodiments, thermal oxidation may be used to grow high quality silicon oxide layers (so-called high temperature oxide layer (HTO)) on a silicon surface, e.g. at a temperatures in the range from about 800° C. to about 1200° C. The thermal oxidation may be performed at atmospheric pressure or at high pressure and as further modification as a rapid thermal oxidation process (RTO). According to various embodiments, also thermal nitridation may be applied to generate high quality nitride or oxynitride layers (e.g. silicon nitride layers or silicon oxynitride layers), e.g. using rapid thermal nitridation (e.g. at temperatures up to about 1300° C.).

Further, according to various embodiments, a process which may be applied to generate a metal layer may be plating, e.g. electroplating or electroless plating. According to various embodiments, a plating process may be used for forming a metal wiring structure or a metallization structure. According to various embodiments, a metallization structure may include for example one or more metal lines and one or more vias, and one or more contact pads being for example exposed at the upper surface of a metallization layer.

It should be noted, that a variety of combinations of materials and processes may be used in a layering process, according to various embodiments. Depending on specific aspects or desired properties of the layer to be formed, as for example crystalline quality, surface roughness, edge covering behavior, growth speed, and yield, the most suitable process may be applied for the respective material, according to various embodiments.

According to various embodiments, some processes during manufacture of an optoelectronic component may require a conformally deposited layer or conformally depositing a layer (e.g. for forming a layer stack over a sidewall of a structure element), which means that a layer (or a material forming a layer) may exhibit only small thickness variations along an interface with another body, e.g. a layer may exhibit only small thickness variations along edges, steps or other elements of the morphology of the interface. According to various embodiments, layering processes such as plating, atomic layer deposition (ALD), or several CVD processes (e.g. ALCVD, or LPCVD), plating (e.g. electroless (ELESS) plating) may be suitable to generate a conformal layer or a conformally deposited layer of a material.

According to various embodiments, some processes during manufacture of an optoelectronic component may require forming a very smooth material layer, e.g. having a surface roughness (RMS) smaller than about 5 nm, e.g. smaller than about 3 nm, e.g. in the range from about 1 nm to about 5 nm, e.g. smaller than about 1 nm.

According to various embodiments, at least one patterning or at least one patterning process may be used for forming an optoelectronic component, an optoelectronic structure (an LED or OLED layer stack), a metallization structure, a contact pad structure (e.g. one or more contact pads), and the like, as described herein. A patterning process may include removing selected portions of a surface layer or of a material. After a surface layer may be partially removed, a pattern (or a patterned layer or patterned surface layer or a plurality of structure elements) may remain at least one of over and in the subjacent structure (e.g. a patterned base layer may remain on a subjacent structure). Since a plurality of processes may be involved, according to various embodiments, there are various possibilities to perform a patterning process, wherein aspects may be: selecting at least one portion of a surface layer (or at least one portion of a material, or at least one portion of a wafer) which shall be removed, e.g. via at least one lithographic process; and removing the selected portions of a surface layer, e.g. via at least one etch process.

According to various embodiments, a variety of lithographic processes may be applied generating a lithographic mask (a so-called photomask), as for example photolithography, microlithography or nanolithography, electron beam lithography, X-ray lithography, extreme ultraviolet lithography (EUV or EUVL), interference lithography, and the like. A lithographic process may include at least one of an initial cleaning process, a preparation process, applying a resist (e.g. a photoresist), exposing the resist (e.g. exposing the photoresist to a pattern of light), developing the resist (e.g. developing the photoresist using a chemical photoresist developer).

A cleaning process, which may be included in a lithographic process (or which may be included in a general process in semiconductor processing), may be applied to remove organic or inorganic contaminations (or material) from a surface (e.g. from a surface layer, from a carrier, from a wafer, and the like) for example via wet chemical treatment. The cleaning process may include at least one of the following processes: RCA (Radio Corporation of America) cleaning (also known as Organic Clean (SC1) and Ionic Clean (SC2)); SCROD (single-wafer spin cleaning with repetitive use of ozonized water and diluted HF); IMEC wafer cleaning; post chemical mechanical polishing (post-CMP) cleaning process; cleaning via de-ionized water (DIW), piranha etch and/or a metal etch; (and the like). According to various embodiments, a cleaning process may also be applied for removing a thin oxide layer (e.g. a thin silicon oxide layer) from a surface (e.g. from a surface layer, from a carrier, or from a wafer, and the like).

According to various embodiments, a preparation process, which may be included in a lithographic process, may be applied to promote the adhesion of the photoresist to a surface (e.g. to a surface layer, to a carrier, or to a wafer, and the like). The preparation process may include applying a liquid or gaseous adhesion promoter (e.g. bis(trimethylsilyl) amine (HMDS)).

A resist, which may be included in a lithographic process, may be applied to cover a surface (e.g. a surface layer, a carrier, or a wafer, and the like) homogeneously. Applying a resist may include spin coating to generate a thin layer of the resist. Afterwards, a resist may be prebaked to drive off excess resist solvent, according to various embodiments. Several types of resists (e.g. a photoresist) may be used adapted to the process of exposing the resist to achieve desired results. Positive photoresists (e.g. DNQ-Novolac, PMMA, PMIPK, PBS, and the like) may be used, and/or negative photoresists (e.g. SU-8, poly isoprene, COP, and the like) may be used.

According to various embodiments, a lithographic process may include exposing a resist so that a desired pattern may be transferred to the resist, e.g. by using light or electrons, wherein the desired pattern may be defined by a patterned mask (e.g. a glass carrier with a patterned chromium layer). Mask-less lithography may be applied, wherein a precise beam (e.g. an electron beam or a laser beam) may be projected without using a mask directly onto the surface including the resist. The wavelength of the used light may range from the wavelength of the visible light to a smaller wavelength in the ultra violet range. The exposure may be performed using X-rays or electrons having even a shorter wavelength than ultra violet light. Projection exposure systems (steppers or scanners) may be used projecting the mask many times onto a surface including a resist to create the complete exposure pattern.

A lithographic process may include developing a resist (e.g. developing a photoresist using a photoresist developer), to partially remove the resist generating a patterned resist layer remaining on the surface (e.g. on a surface layer or on a carrier, a wafer, and the like). Developing a resist may include a post exposure bake (a heat treatment, e.g. rapid thermal processing) before the actual developing process may be performed. The developing process may include a chemical solution (a so-called developer) as for example sodium hydroxide or tetramethylammonium hydroxide (TMAH, a metal ion free developer). According to various embodiments, the remaining patterned resist may be solidified in a hard bake process (a heat treatment, e.g. rapid thermal processing), realizing a more durable protecting layer for later processes as for example ion implantation, wet chemical etching, or plasma etching (and the like).

Independently of the described lithographic processes, a resist may be removed completely at a desired processing stage (e.g. after at least one of an etch process, ion implantation process, and a deposition process have been performed) in a so-called resist strip process. A resist may be removed chemically and/or by using oxygen plasma.

It should be noted, that a lithographic process, including applying a resist, exposing a resist, and developing a resist may also be considered as a patterning process, wherein a patterned resist layer (a soft mask, or a resist mask) may be generated by the lithographic process. Subsequently, a pattern may be transferred from a patterned resist layer to a previously deposited or grown layer (or a carrier, and the like) using an etch process, wherein the previously deposited or grown layer may include a hard mask material as for example an oxide or a nitride (e.g. silicon oxide, e.g. silicon nitride) creating a so-called hard mask.

According to various embodiments, an etch process, which may be included for example in a patterning process or which may be used for forming a recess, may be applied to remove material from a previously deposited layer, a grown surface layer, a carrier (or substrate, or wafer), and the like. An etch process may be adapted and performed depending on the specific requirements for the desired process. An etch process may include a wet etch process and/or a dry etch process. An etch process may be selective or non-selective with respect to two different materials or may be configured to be selective or non-selective, wherein a selective etch process may provide a different etching rate for a first material than for a second material and a non-selective etch process may provide the same etching rate for a first material and a second material. An etch process may be isotropic or anisotropic or may be configured to be isotropic or anisotropic, wherein an anisotropic etch process may have different etching rates along different spatial directions and an isotropic etch process may have the same etching rates along all spatial directions. An etch process may be anisotropic due to different etching rates along different crystallographic directions of the material to be etched. An etch process using a masking material and a dry etch process (e.g. plasma etching or reactive ion etching) may allow forming anisotropic structures, e.g. recesses.

According to various embodiments, a selective etch process may include a specific etchant (e.g. a wet etchant, e.g. a plasma etchant) which may allow etching at least one desired material while sparing another material, e.g. an exposed region of a layer or carrier may be removed (etched) while a mask material (or another material) may remain. Silicon dioxide may be removed (etched) selectively compared to silicon by using hydrofluoric acid ($HF_{aq}$) as etchant. Silicon dioxide may be removed (etched) together with silicon (non-selectively) by using a mixture of nitric acid and hydrofluoric acid ($HNO_3/HF_{aq}$) as etchant.

According to various embodiments, an anisotropic wet etch process may reveal a different etching rate along a respective crystallographic direction of a specific material. A wet etch process including potassium hydroxide (KOH) as etchant may be performed to etch silicon (e.g. a silicon wafer) anisotropically. A wet etch process including ($HNO_3/HF_{aq}$) as etchant may be performed to etch silicon (e.g. a silicon wafer) isotropically. An anisotropic dry etch process may reveal a different etching rate for surfaces with a specific geometric alignment. A physical etch process may be applied (e.g. ion beam milling, e.g. plasma etching) to perform an anisotropic removal of a material.

Further, to create at least one of a deep penetration, a steep-sided hole, and a trench in a material (e.g. in a wafer, in a substrate, in a deposited or grown layer, and the like) deep reactive-ion etching (DRIE) may be applied. A pulsed etching (time-multiplexed etching) may be applied.

According to various embodiments, a patterned layer may also serve as a mask (a so-called hard mask) for other processes like etching, ion implantation, and/or layering. Further, a patterned photoresist may also serve as a mask (a so-called soft mask). The mask material may usually be selected with regard to specific needs as for example chemical stability, e.g. to perform a selective etch process which does not affect the mask material (e.g. which may not etch away the mask material completely), or mechanical stability, e.g. to protect regions from being penetrated by ions, or to define the shape of generated structure elements during a layering process, and the like.

According to various embodiments, a heat treatment may be applied for forming an optoelectronic component, an optoelectronic structure (an LED or OLED layer stack), a metallization structure, and/or a contact pad structure (e.g. one or more contact pads), or a heat treatment may be included in various processes (or at various process stages) during manufacture of an optoelectronic component, as described herein, e.g. in combination with a patterning process, after applying photoresist, and/or after depositing electrical contacts to alloy the electrically conductive material (e.g. a metal) with a carrier (or with the subjacent structure), or to provide optimal deposition conditions for a layering process. The heating of a carrier (a wafer, a substrate, and the like) may be performed with direct contact, e.g. a hot plate, or by radiation, e.g. using a laser or lamps. A rapid thermal processing (RTP) may be applied, which may be performed under vacuum conditions using a laser heater or lamp heater, wherein a material (e.g. a wafer, a substrate, a carrier, and the like) may be heated up to several hundred degrees Celsius or up to about 1000° C. or even greater within a short time period, e.g. within several seconds (e.g. about 1 s to about 10 s). Subsets of rapid thermal processing are rapid thermal annealing (RTA) and rapid thermal oxidation (RTO).

At least one metallization process may be applied for manufacture of a contact pad structure or a metallization structure. A metallization may be in direct contact with at least one structure element of an electronic circuit (or with at least one structure on a carrier), wherein a metallization process may be used to provide required electrical connections (or interconnections) for the electronic circuit and or an integrated circuit on a carrier. A metallization process (forming a metallization) may include at least one layering process and at least one patterning process. A metallization process may include depositing a layer of a dielectric material (e.g. a low-κ dielectric material, e.g. undoped silicate glass, and the like), forming contact holes at the desired locations (e.g. using at least one patterning process), and filling the contact holes with at least one electrically conductive material (e.g. with at least one of a metal (e.g. aluminium, copper, tungsten, titanium, molybdenum, gold, platinum, and the like), a metallic material (e.g. titanium nitride, platinum silicide, titanium silicide, tungsten silicide, molybdenum silicide, and the like), electrically conductive polysilicon, and a metal alloy (e.g. aluminium-silicon alloys, aluminium-copper alloys, aluminium-silicon-copper alloys, nichrome, titanium-tungsten alloys, and the like)) using a layering process. Further, a metallization process (or a metallization process) may include forming additional layers for example as a bather (e.g. including at least one of molybdenum, a transition metal nitride (e.g. titanium nitride), platinum silicide, titanium silicide, tungsten silicide, molybdenum silicide, borides, tantalum, tungsten, and the like), or as adhesion promoter (e.g. including at least one of platinum silicide, titanium silicide, tungsten silicide, molybdenum silicide, and the like). Further, a dielectric layer may include a layer stack, e.g. one or more layer being disposed over each other, including for example silicon oxide, silicon nitride, and/or silicon oxynitride. Silicon oxide, silicon nitride, and/or silicon oxynitride may be used as a final dielectric layer or a final passivation layer on the top of the metallization. Further, an inter-level dielectric or inter-layer dielectric (ILD), may be used to electrically separate the components of a wiring structure (e.g. interconnect lines, contact pads, and the like) being arranged in several levels of a multilevel metallization or being arrange in a metallization layer of a multilevel metallization. The ILD may include low-κ dielectric material (e.g. silicon oxide, porous silicon, and the like) to reduce the electrical coupling between adjacent components of the wiring structure.

According to various embodiments, applying a metallization process may further include a planarization of a carrier surface (wafer surface, substrate surface, and the like) and/or a planarization of intermediate layers included in a multilevel metallization process (e.g. using chemical mechanical polishing (CMP)).

A planarization process may be applied for example to reduce the surface roughness or to reduced variations in the depth profile of a surface of a carrier including structure elements having different heights, since some processes may require a flat surface (a planar surface) (e.g. high resolution lithography). A planarization process may be desired as the number of performed layering processes and patterning processes increases and as a planar surface may be required. A chemical mechanical polishing process (CMP or CMP process) may be performed, wherein this process may be selective to specific materials on the surface of a carrier (of a wafer, substrate, surface layer, and the like). A chemical mechanical polishing process (CMP) may be performed, wherein this process may be non-selective to specific materials on the surface of a carrier (of a wafer, substrate, surface layer, and the like). A planarization process may be included additionally in several processes, e.g. in layering processes, patterning processes, and the like. A chemical mechanical polishing process (CMP) may be used to remove a surface layer or a part of a surface layer.

According to various embodiments, an electroless plating process may be applied for example to provide a thin electrically conductive layer having beneficial mechanical properties, e.g. a high quality interface to the underlying material and/or a high adhesion to the underlying structure, wherein the thin electrically conductive layer may be an electrode for an optoelectronic structure.

According to various embodiments, a carrier (e.g. a substrate, a wafer, and the like) may be made of semiconductor materials of various types, including silicon, germanium, Group III to V or other types, including polymers, for example, although in another embodiment, other suitable materials can also be used. The wafer substrate may be made of silicon (doped or undoped), in an alternative embodiment, the wafer substrate may be a silicon on insulator (SOI) wafer. As an alternative, any other suitable semiconductor materials can be used for the wafer substrate, for example semiconductor compound material such as gallium arsenide (GaAs), indium phosphide (InP), but also any suitable ternary semiconductor compound material or quaternary semiconductor compound material such as indium gallium arsenide (InGaAs). A carrier may include a coated structure, e.g. a metal tape coated with silicon, and the like. A carrier may further include a polymer, a laminate, or a metal. A carrier may further include a polymer foil, glass (e.g. silicon oxide based glass), or another suitable carrier being processable in semiconductor technology.

The term "dielectric" as used herein referring to a dielectric material, a dielectric layer, a dielectric structure, and the like, may be used herein to mean an electrically insulating material in general. Further the term "dielectric" may refer to a so-called low-κ material, as typically used in metallization structures in any semiconductor technology. According to various embodiments, at least one of the following materials may be used to provide a dielectric layer or a dielectric structure: silicon oxide (dielectric constant of 3.9) and a material having a smaller a dielectric constant than silicon oxide, e.g. fluorine-doped silicon dioxide, fluorosilicate glass, carbon-doped silicon dioxide, porous silicon dioxide, porous carbon-doped silicon dioxide, organic dielectrics, dielectric polymers, silicone based polymeric dielectrics, polynorbornenes, benzocyclobutene, polytetrafluoroethylene, resins, hydrogen silsesquioxane (HSQ), methylsilsesquioxane (MSQ) and the like.

FIG. 1A shows schematically an optoelectronic component 100 in a cross sectional view, according to various embodiments, wherein the optoelectronic component 100 may include: a metallization structure 104 disposed over a carrier 102, the metallization structure 104 including at least one contact pad 104c; and an optoelectronic structure 108 disposed over the metallization structure 104, the optoelectronic structure including at least one electrode 108e being in direct contact with the at least one contact pad 104c of the metallization structure 104, wherein the electrode 108e includes at least one of electroless plated gold and electroless plated silver.

According to various embodiments, the carrier 102 may include any material being suitable as a basis for a metallization structure 104, e.g. the carrier 102 may include glass, silicon (a silicon wafer), a metal, a metal foil, a polymer, a polymer foil, and the materials already described. Further, the metallization structure 104 may be formed or disposed over at least one surface of the carrier 102, e.g. over an upper surface or over a main processing surface of the carrier 102. The metallization structure 104 may completely cover the at least one surface of the carrier 102 or partially cover the at least one surface of the carrier 102. As shown for example in FIG. 1A, the metallization structure 104 may be in direct contact with the carrier 102. Alternatively, there may be one or more additional layers disposed between the metallization structure 104 and the carrier, e.g. serving as diffusion barrier or as adhesion promoter and the like.

According to various embodiments, the optoelectronic structure 108 may be formed or disposed over the metallization structure 104, e.g. being in direct contact with the metallization structure 104. The at least one electrode 108e of the optoelectronic structure 108 may be formed or disposed over the at least one contact pad 104c of the metallization structure 104, e.g. being in direct contact with the at least one contact pad 104c of the metallization structure 104.

Figure 1B:
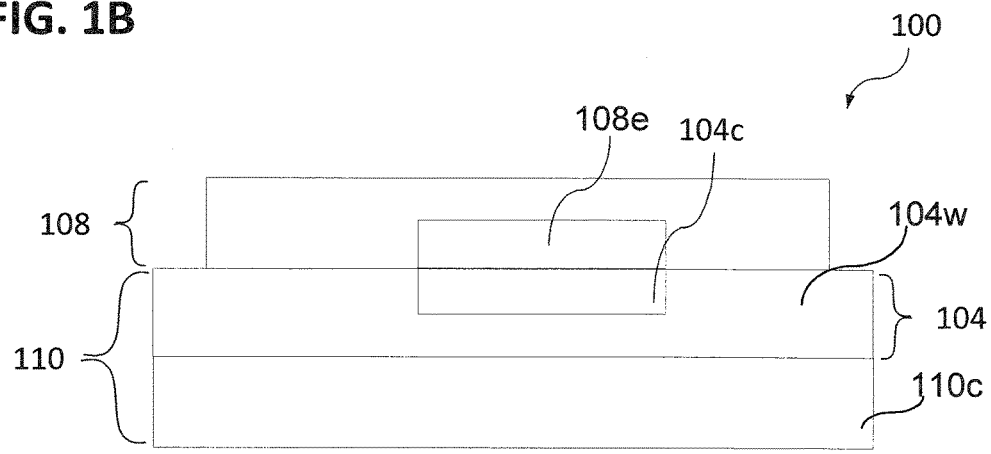

Alternatively, as illustrated in FIG. 1B in a cross sectional view, an optoelectronic component 100 may include: an electronic circuit structure 110 including an electronic circuit 110c and a metallization structure 104 disposed over the electronic circuit 110c, the metallization structure 104 may include one or more contact pads 104c (or at least one contact pad 104 or at least one contact pad structure 104) being electrically connected to the electronic circuit 110c; and an optoelectronic structure 108 disposed over the metallization structure 104, the optoelectronic structure 108 including at least one electrode structure 108e (e.g. at least one electrode, e.g. one or more electrode structures) being in direct contact with the one or more contact pads 104c, wherein the electrode structure 108e includes an electroless plated electrically conductive material.

According to various embodiments, the metallization structure 104 may be formed or disposed over at least one surface of the electronic circuit 110c, e.g. over an upper surface of the electronic circuit 110c. The metallization structure 104 may completely cover the electronic circuit 110c or may partially cover the electronic circuit 110c. Illustratively, the electronic circuit 110c may be the carrier for the metallization structure 104. The metallization structure 104 may for example provide the functionality of the electronic circuit 110c, e.g. connecting one or more structure elements (e.g. transistors, switches, diodes, and the like) of the electronic circuit 110c. According to various embodiments, the metallization structure 104 may be electrically conductively connected to the electronic circuit 110c. According to various embodiments, there may be one or more additional layers disposed between the metallization structure 104 and the electronic circuit 110c, e.g. serving as diffusion barrier or as adhesion promoter and the like, wherein these one or more additional layers may allow the electrical connection between the metallization structure 104 and the electronic circuit 110c. According to various embodiments, the metallization structure 104 and the electronic circuit 110c may form an electronic circuit structure 110.

According to various embodiments, the optoelectronic structure 108 may be formed or disposed over the metallization structure 104, e.g. being in direct contact with the metallization structure 104. The at least one electrode 108e of the optoelectronic structure 108 may be formed or disposed over the at least one contact pad 104c of the metallization structure 104, e.g. being in direct contact with the at least one contact pad 104c of the metallization structure 104, as described above. According to various embodiments, the electronic circuit 110c may be a silicon based integrated circuit. According to various embodiments, the electronic circuit structure 110 may be a part of a chip.

Figure 1C:
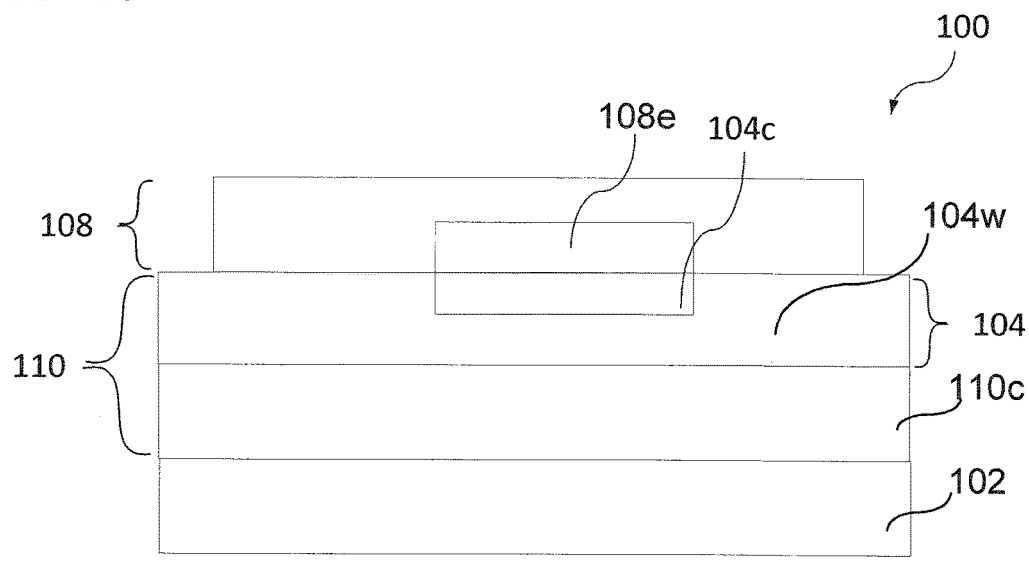

Alternatively, as illustrated in FIG. 1C in a cross sectional view, the electronic circuit structure 110 (and the electronic circuit 110c) may be formed or disposed over a carrier 102, e.g. the electronic circuit 110c may be formed or disposed at least one of over an in the carrier 102, wherein the metallization structure 104 may be disposed over the electronic circuit 110c. According to various embodiments, the electronic circuit 110c may be an integrated circuit being formed over a silicon wafer 102. Further, as described before, the optoelectronic structure 108 may be disposed over the metallization structure 104, the optoelectronic structure 108 including at least one electrode structure 108e (e.g. at least one electrode, e.g. one or more electrode structures) being in direct contact with one or more contact pads 104c of the metallization structure 104, wherein the electrode structure 108e includes an electroless plated electrically conductive material.

In the following, the optoelectronic component 100 respectively illustrated in FIGS. 1A to 1C are described in more detail.

According to various embodiments, the electrode 108e (or the electrode structure 108e) may have substantially the same lateral extension as the at least one contact pad 104c. According to various embodiments, the at least one contact pad 104c may have a lateral extension of about several tens of nanometers up to several tens of micrometers, e.g. a lateral extension (a width) in the range from about 50 nm to about 50 μm, e.g. in the range from about 100 nm to about 10 µm; in the range from about 200 nm to about 3 µm. Referring to this, at least one electrode of the electrode structure 108e may have a lateral extension of about several tens of nanometers up to several tens of micrometers, e.g. a lateral extension (a width) in the range from about 50 nm to about 50 µm, e.g. in the range from about 100 nm to about 10 µm; in the range from about 200 nm to about 3 µm.

According to various embodiments, the electrode 108e or the electrode structure 108e, as described above, may provide a smooth electrically conductive primary layer which may be used as electrode layer in electronic devices and/or in optoelectronic devices, e.g. in semiconductor devices generating and/or converting light, e.g. in an organic light emitting diode (OLED), e.g. in an OLED-display. According to various embodiments, the electrode 108e may be a part of at least one of the following optoelectronic components: a photodiode, a solar cell, an organic photodiode, an organic solar cell, a phototransistor, an organic phototransistor, a photomultiplier, an organic photomultiplier, an integrated optical circuit (IOC) element, an organic integrated optical circuit (IOC) element, a photo-resistor, a charge-coupled imaging device, an organic photo-resistor, an organic charge-coupled imaging device, a laser diode, an organic laser diode, a laser, a light emitting diode (LED), an organic LED (OLED), a top-emitting OLED, a bottom-emitting OLED, an active matrix organic light emitting diode (AMO-LED). According to various embodiments, the optoelectronic structure 108 may be configured (designed) to provide the optoelectronic component 100, as described before.

According to various embodiments, the electronic circuit 110c may include at least on component of the following group of components: a resistor, a transistor (a field-effect transistor), a capacitor, an inductor, a diode, a wiring or conductive path, a carrier or a substrate. According to various embodiments, the electronic circuit 110c may include at least one of the following: an integrated circuit structure, a chip, a die, a microprocessor, a microcontroller, a memory structure, a logic circuit, a sensor, a nano-sensor, an integrated transceiver, a micro-mechanical system, a micro-electronic device, a nano-electronic device, an electrical circuit, a digital circuit, an analog circuit, and any other electronic device based on semiconductor technology.

According to various embodiments, the electronic circuit 110c may include a complementary metal oxide semiconductor circuit. According to various embodiments, the electronic circuit 110c may include an electronic circuitry provided in complementary metal oxide semiconductor technology. According to various embodiments, the electronic circuit 110c may be (or at least a part of) at least one of a microprocessor, a microcontroller, and a digital logic circuit e.g. provided in CMOS technology.

According to various embodiments, the electronic circuit 110c may include at least one of the following basic semiconductor technologies: MOS-technology (metal oxide semiconductor technology), nMOS-technology (n-channel MOS-technology), pMOS-technology (p-channel MOS-technology), CMOS-technology (complementary metal oxide semiconductor technology). According to various embodiments, the electronic circuit 110c may include a field effect transistor (FET) (e.g. a metal oxide semiconductor field effect transistor (MOSFET), a fin field effect transistor (FinFET), and/or a floating gate transistor.

According to various embodiments, the electronic circuit structure 110 may include at least one metallization layer 104, e.g. to provide the wiring for the electronic circuit 110c and/or to provide an electrical connection between the electronic circuit 110c and the electrode 108e. According to various embodiments, the at least one metallization layer 104 may include for example a patterned dielectric layer, e.g. including an electrically insulating material, e.g. a low-κ material, and a wiring including an electrically conductive material, e.g. aluminum and/or copper. According to various embodiments, the at least one metallization layer may be formed using aluminum technology and/or copper technology.

Figure 1D:
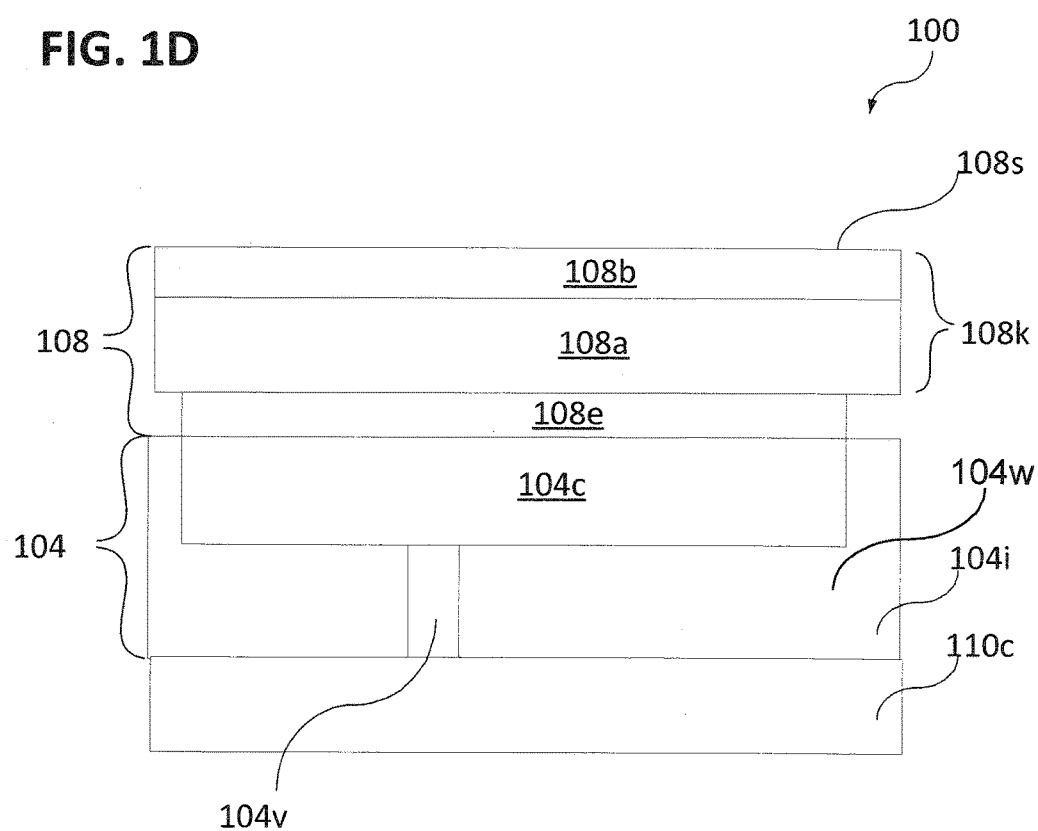
FIG. 1D shows a metallization structure and an optoelectronic structure being disposed over the metallization structure in a schematic cross sectional view or side view, according to various embodiments.
Figure 5A:
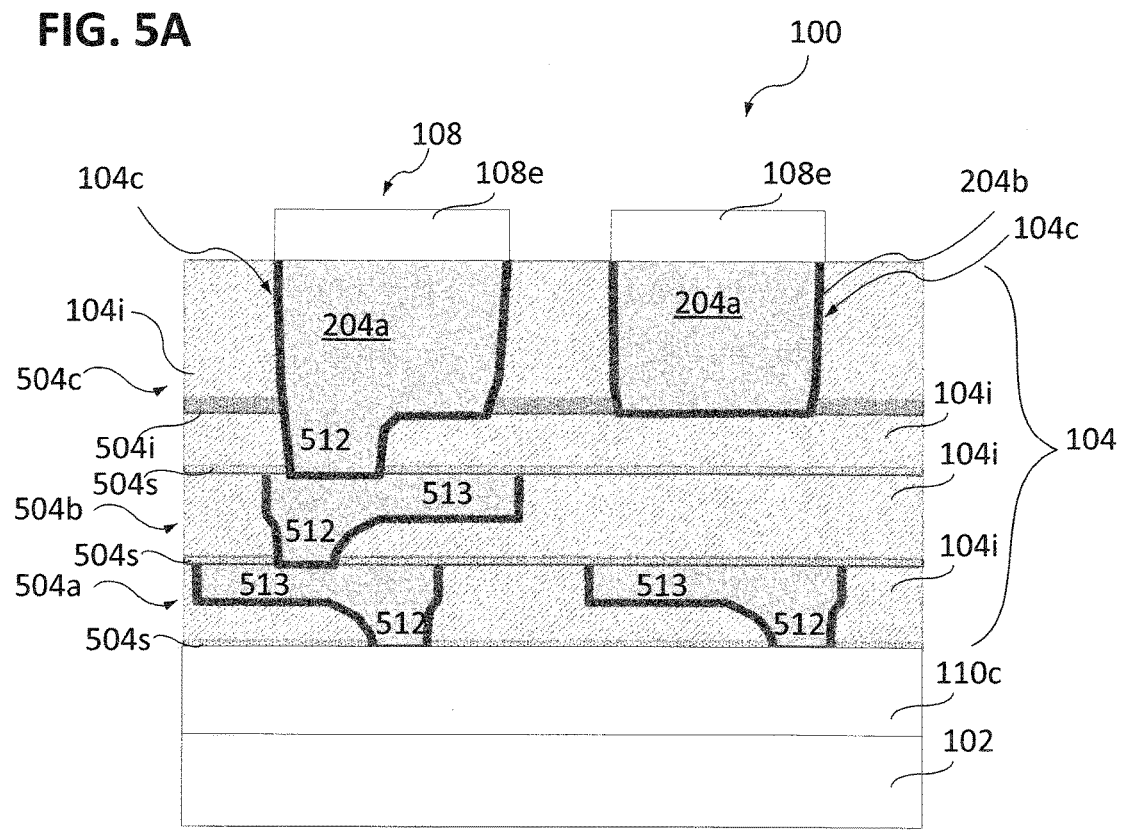
FIGS. 5A to 5C respectively show an optoelectronic component in a schematic cross sectional view or side view, according to various embodiments.
Figure 5B:
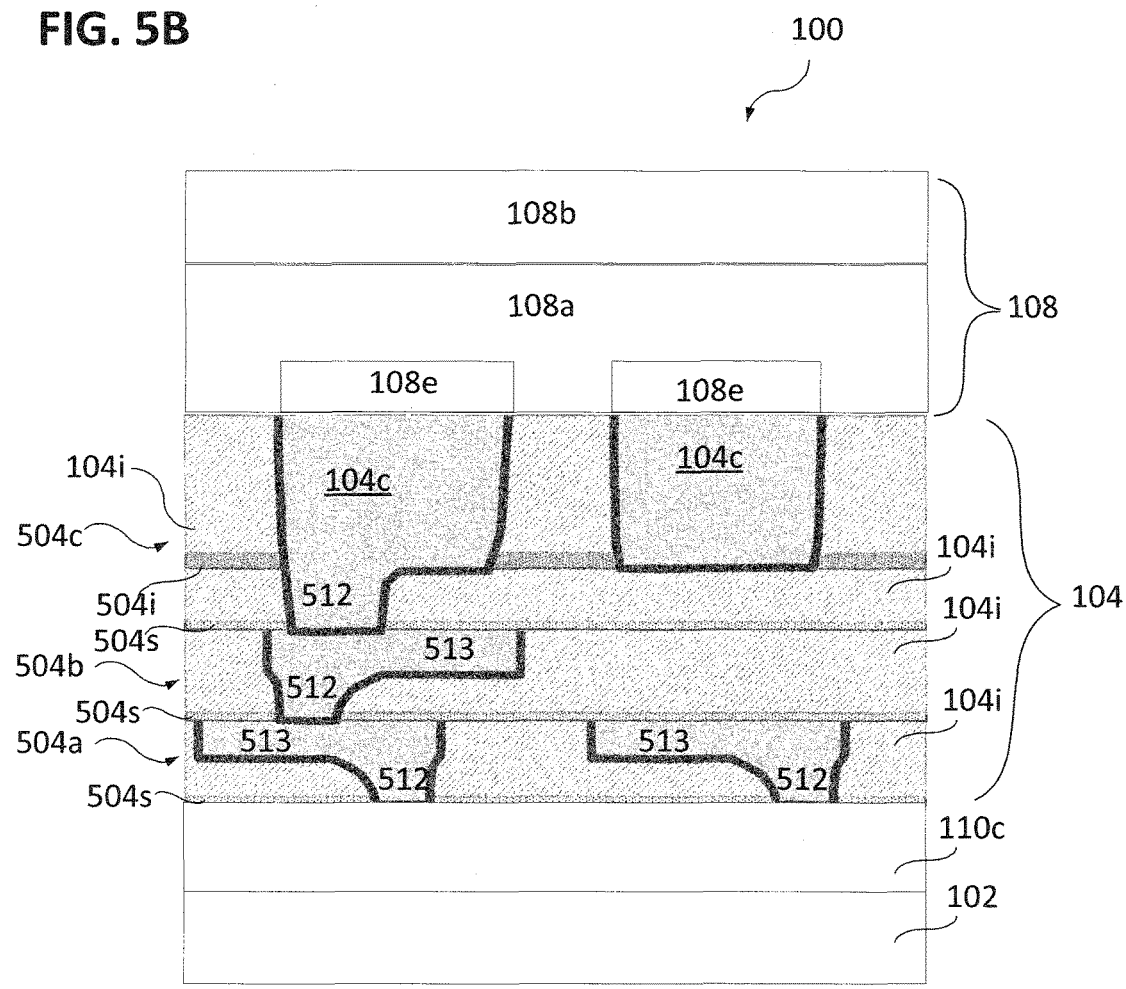
Figure 5C:
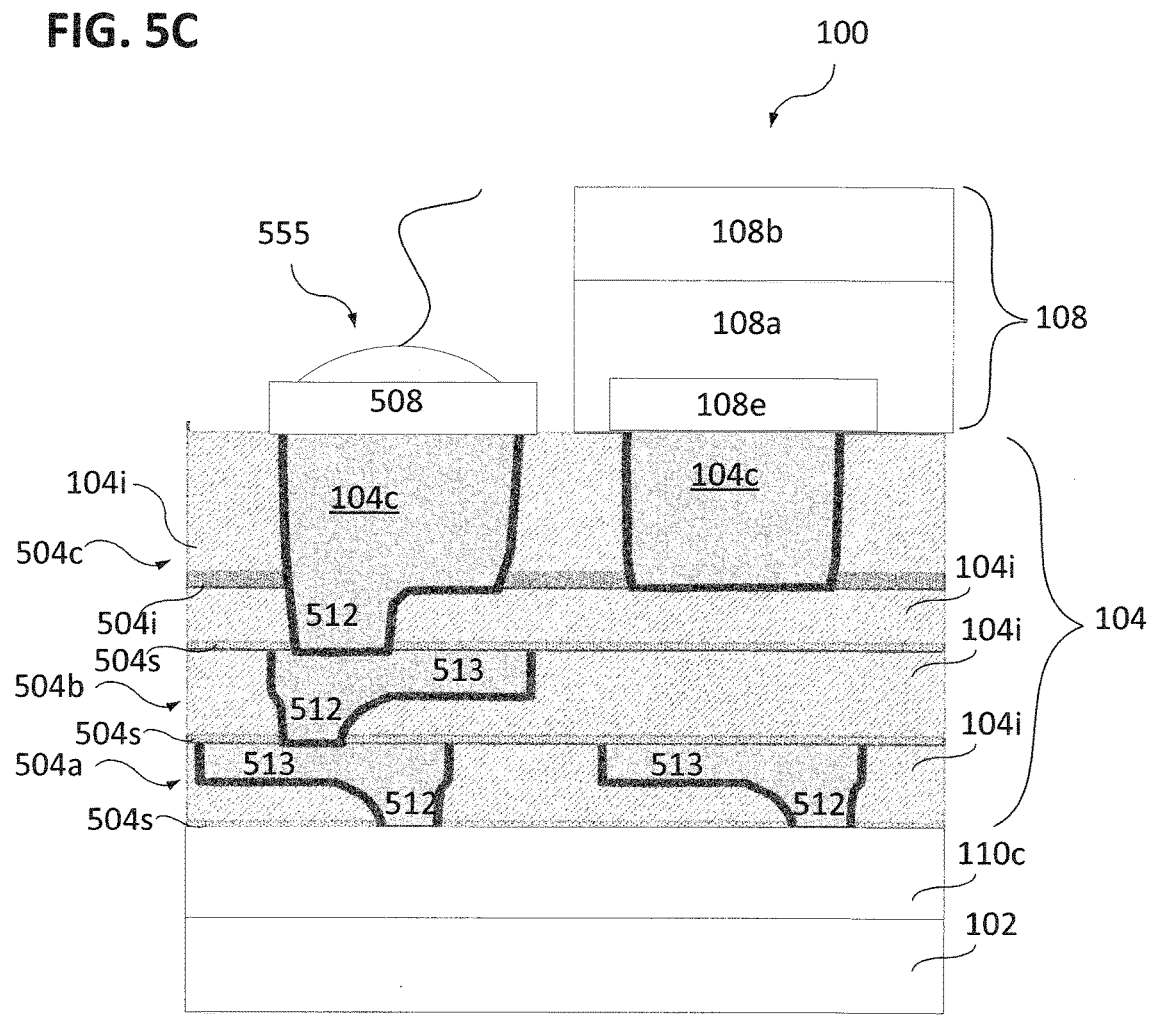

According to various embodiments, the electronic circuit 110c may be electrically conductively coupled to the at least one electrode 108e via a metallization structure 104 including a plurality of metallization layers 104, c.f. FIGS. 5A to 5C. As shown in FIG. 1D, the metallization structure 104 may further include at least one via 104v (or a plurality of vias and/or through vias, as illustrated in FIGS. 5A to 5C). The metallization structure 104 may further include at least one contact pad 104c (e.g. a plurality of contact pads 104c, as illustrated in FIGS. 5A to 5C) being disposed at the surface of the metallization structure 104 facing the optoelectronic structure 108.

According to various embodiments, the metallization structure 104 may include at least one electrically conductive material (e.g. electrically conductive portions), e.g. a metal (aluminum, copper, cobalt, tungsten, titanium, tantalum, vanadium). According to various embodiments, the metallization structure 104 may further include at least one dielectric material 104i (e.g. dielectric portions), e.g. at least one low-κ dielectric, e.g. at least one of the following group of dielectric materials: silicon dioxide, (fluorine or carbon) doped silicon dioxide, porous silicon dioxide, porous (fluorine or carbon) doped silicon dioxide, polymers, organic polymeric dielectrics, polyimide, polynorbornenes, benzocyclobutene, polytetrafluoroethylene, and silicone based polymeric dielectrics (e.g. hydrogen silsesquioxane or methylsilsesquioxane).

According to various embodiments, the metallization layer 104 may include at least one patterned dielectric layer 104i, e.g. a low-κ dielectric layer, and electrical connections (e.g. metal lines and vias) realizing the functionality of the underlying electrical circuit 110c, wherein the metallization structure 104 may further provide the wiring 104w (e.g. including metal lines, vias 104v and contacts 104c) to electrically connect the electrode 108e (and therefore the optoelectronic structure 108) with the electronic circuit 110c. According to various embodiments, the one or more electrodes 108e (e.g. the electrode structure 108e of the optoelectronic structure 108) may be controlled via the electronic circuit 110c. According to various embodiments, the optoelectronic structure 108 may further include a plurality of electrodes 108e being individually addressed (or addressable) via the electronic circuit 110c. According to various embodiments, the electronic circuit 110c may provide the power supply for the optoelectronic structure 108 (e.g. providing a voltage and/or a current to the electrode 108e or to the plurality of electrodes 108e being included in the optoelectronic structure 108). Therefore, the optoelectronic structure 108 may be for example controlled via the electronic circuit 110c, so that the electronic circuit 110c may be the driver circuit for the optoelectronic structure 108.

According to various embodiments, the optoelectronic structure 108 may be configured to provide an optoelectronic device selected from a group of optoelectronic devices consisting of: a light emitting device; a photovoltaic cell; and an optoelectronic sensor. According to various embodiments, the electrode 108e may be a bottom electrode (e.g. a first electrode) for a light emitting device; a photovoltaic cell; and/or an optoelectronic sensor. According to various various embodiments, the optoelectronic structure 108 may include at least one light emitting diode. According to various embodiments, the optoelectronic structure 108 may include a plurality of light emitting diodes. According to various embodiments, the optoelectronic structure 108 may include at least one inorganic semiconductor material being configured as an electroluminescence layer or region 108*a*. According to various embodiments, as shown in FIG. 1D, the electrode 108*e* may provide a first electrode 108*e* for the at least one light emitting diode.

According to various embodiments, the optoelectronic structure 108 may include a plurality of single electrodes 108*e*, wherein each electrode 108*e* of the plurality of electrodes included in the optoelectronic structure 108 or in the optoelectronic component 100 may be an electrode 108*e* for a respective light emitting diode.

According to various embodiments, the optoelectronic structure 108 may be an LED array including a plurality of light emitting diodes being controlled by the electronic circuit 110*c*. According to various embodiments, the at least one light emitting diode may be a green emitting LED, a red emitting LED, a blue emitting LED, an orange emitting LED, a yellow emitting LED, a violet emitting LED, or an LED emitting any other possible color. According to various embodiments, the at least one light emitting diode may be a phosphor converted LED, e.g. a phosphor converted blue LED or ultra violet LED (UV-LED). According to various embodiments, the at least one light emitting diode may include at least one material of the following group of materials providing the electroluminescence material: Gallium(III) phosphide (GaP), Aluminum gallium indium phosphide (AlGaInP), Aluminum gallium phosphide (AlGaP), Indium gallium nitride (InGaN), Gallium(III) nitride (GaN), Gallium arsenide (GaAs), Aluminum gallium arsenide (AlGaAs).

According to various embodiments, the at least one light emitting diode may include an additional electrode 108*b* (a second electrode 108*b*), wherein the electrode 108*e* may be a bottom electrode 108*e* and the additional electrode may provide a top electrode 108*b*. According to various embodiments, the additional electrode 108*b* may be transparent for the light emitted from the optoelectronic structure 108 (or the additional electrode may be at least partially transparent to specific wavelengths being emitted from the optoelectronic structure 108), wherein the optoelectronic structure 108 may include an electroluminescence layer 108*a* being arranged between the bottom electrode 108*e* and the transparent additional electrode 108*b*.

According to various embodiments, a transparent electrode 108*b* may include a transparent electrically conductive oxide (TCO), e.g. tin-doped indium oxide (ITO), e.g. aluminum-doped zinc oxide (AZO), e.g. indium-doped cadmium oxide (ICO). According to various embodiments, the transparent top electrode 108*b* (e.g. a TCO layer) may be formed (e.g. deposited) using a chemical vapor deposition (CVD) process or a physical vapor deposition (PVD) process, e.g. metal organic chemical vapor deposition (MOCVD), metal organic molecular beam deposition (MOMBD), atomic layer deposition, molecular beam epitaxy (MBE), an atomic layer CVD process (ALCVD), spray pyrolysis, pulsed laser deposition (PLD), sputtering, magnetron sputtering, DC-sputtering, AC-sputtering.

Figure 3A:
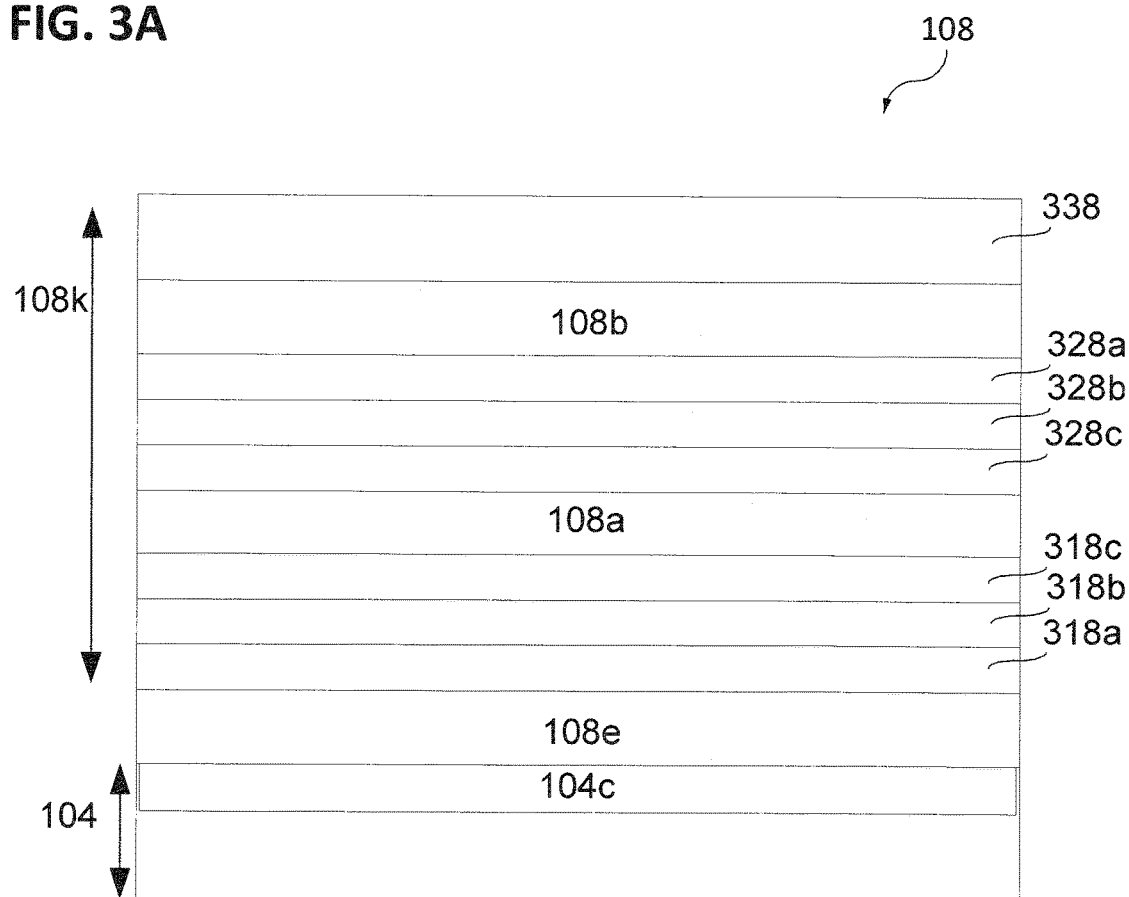
FIGS. 3A and 3B respectively show a metallization structure and an optoelectronic structure being disposed over the metallization structure in a schematic cross sectional view or side view, according to various embodiments.
Figure 3B:
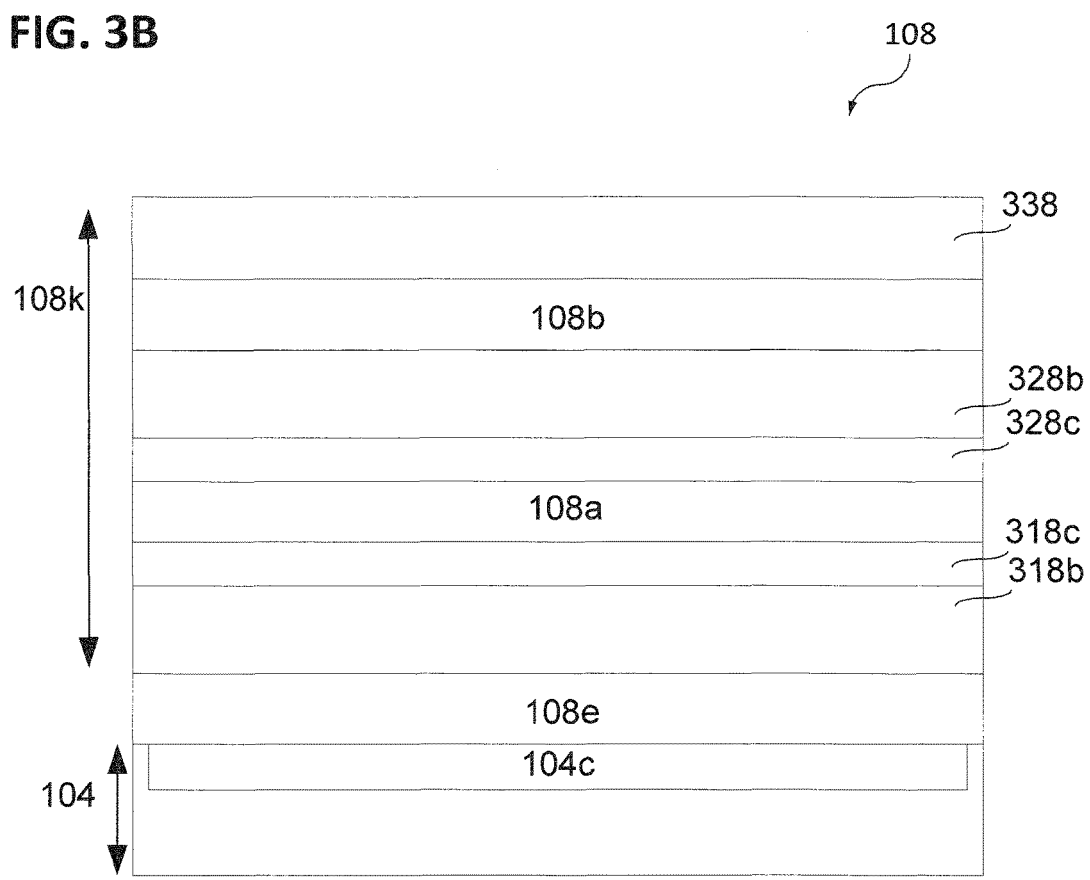

According to various embodiments, the optoelectronic structure 108 may be configured as an organic light emitting diode. In this case, the electroluminescence layer 108*a*, which may generate light, may include an organic material, e.g. a polymer or small organic molecules. Further, the at least one organic light emitting diode 108 may include functional layers or a functional layer stack, e.g. charge carrier injection layers for electron injection and/or hole injection, charge transport layers for electron transport and/or hole transport, barrier layers configured as electron blocking layer or hole blocking layer, and other transfer layers, e.g. to adapt the electronic properties of the layers and the material, e.g. to change work functions and band structures (c.f. FIG. 3A and FIG. 3B).

According to various embodiments, the organic light emitting diode 108 may include at least a first electrode 108*e* and a second electrode 108*b*, wherein the electroluminescence layer 108*a* may be arranged between the first and the second electrode. According to various embodiments, one of the electrodes included in the organic light emitting diode 108 may be transparent to the emitted light, wherein the other electrode of the electrodes may be configured to be highly reflective (to be a mirror). Therefore, a first electrode may be configured, as described herein referring to the electrode 108*e*, to reflect the light emitted from the electroluminescence layer 108*a*. A second electrode 108*b* may include for example a transparent electrically conductive oxide (TCO), such that light may be emitted from the electroluminescence layer 108*a* to the environment, e.g. through the surface 108*s* of the optoelectronic structure 108. Depending on the arrangement of the mirror electrode 108*e* and the second transparent electrode 108*b*, the organic light emitting diode may be a bottom-emitting organic light emitting diode or a top-emitting organic light emitting diode.

According to various embodiments, an optoelectronic component 100 may include a plurality of organic light emitting diodes 108, e.g. arranged in a regular array, wherein the organic light emitting diode arrangement may be controlled via the underlying electronic circuit 110*c*, as described above. In other words, the optoelectronic component 100 may be configured as an organic light emitting diode display device.

According to various embodiments, the optoelectronic component 100 may include a plurality of organic light emitting diodes having various colors, e.g. depending on the configuration of the electroluminescence layer 108*a*, e.g. the used polymers or molecules. According to various embodiments, the optoelectronic component 100 may include a plurality of organic light emitting diodes having various colors providing white light, e.g. used as an OLED backlight for a display device. According to various embodiments, the plurality of organic light emitting diodes may have substantially the same color, wherein the optoelectronic component 100 may in this case further include a color filter layer, e.g. to provide the desired different colors. According to various embodiments, a color filter layer may include at least one phosphorescent or fluorescent material (see e.g. FIG. 4A to FIG. 4D).

According to various embodiments, the electronic circuit 110*c* and the electrode 108*e* may provide the basis for an optoelectronic layer stack 108*k* being formed over the electrode 108*e*, wherein the optoelectronic layer stack 108*k* and the electrode 108*e* may for example provide a light emitting electronic device 108. In this case, the electrode 108*e* may function as a mirror layer and an electrode for the light emitting electronic device. Using the electrode 108*e* formed from an electroless deposited metal, as described above, may enhance the efficiency of a light emitting optoelectronic component 100, or light emitting optoelectronic structure 108, since the physical properties of the electrode 108*e*, as described above, may be beneficial for being used as a mirror electrode in a light emitting structure.

Figure 4A:
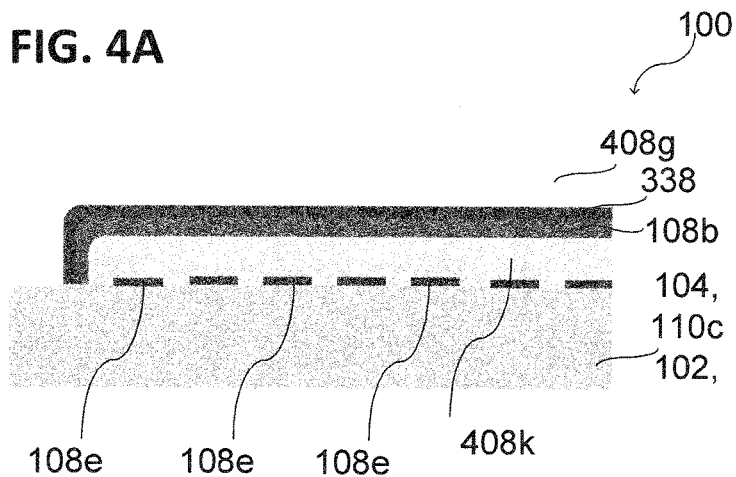
FIGS. 4A and 4B respectively show an optoelectronic component in a schematic cross sectional view or side view, according to various embodiments.

Further, according to various embodiments, providing a smooth primary layer or a smooth electrode layer 108e (e.g. the electrode 108e as already described) may enable the precise control of the layer thicknesses of the functional layers (e.g. of the optoelectronic layer stack 108k) of the light emitting structure deposited on top of the smooth electrode layer (see for example FIG. 3A and FIG. 4A). In this case, it may not be necessary to take thickness variations of the electrode into account which may allow for example reducing the layer thickness of a functional layer on top of the electrode 108e. According to various embodiments, a smooth electrode layer may further allow depositing layers having a larger thickness on top of the electrode layer 108e having a sufficient high quality (roughness and microstructure). Therefore, the efficiency of a light emitting electronic device (e.g. OLED) may be enhanced, since each of the functional layers in the OLED layer stack may be formed with the optimal thickness as desired. In other words, a reduced surface layer roughness of the electrode 108e may reduce the necessary layer thickness of one or more layers being deposited on top of the electrode 108e and/or may increase the quality of the grown layers. Further, the electrode 108e may be chemically stable, due to the enhanced crystalline quality being achieved by the electroless deposition process.

According to various embodiments, the optoelectronic layer stack 108k deposited on top of the electrode 108e may include one or more additional electrode layers, e.g. influencing the reflectivity and the electronic properties, e.g. work functions, of the light emitting structure 108.

Various modifications and/or configurations of the optoelectronic component 100 and details referring to the metallization structure 104 and the optoelectronic structure 108 are described in the following, wherein the features and/or functionalities described referring to FIG. 1A to FIG. 1D may be included analogously. Further, the features and/or functionalities described in the following may be included in the optoelectronic component 100 or may be combined with the optoelectronic component 100, as described before referring to FIG. 1A to FIG. 1D.

Figure 2A:
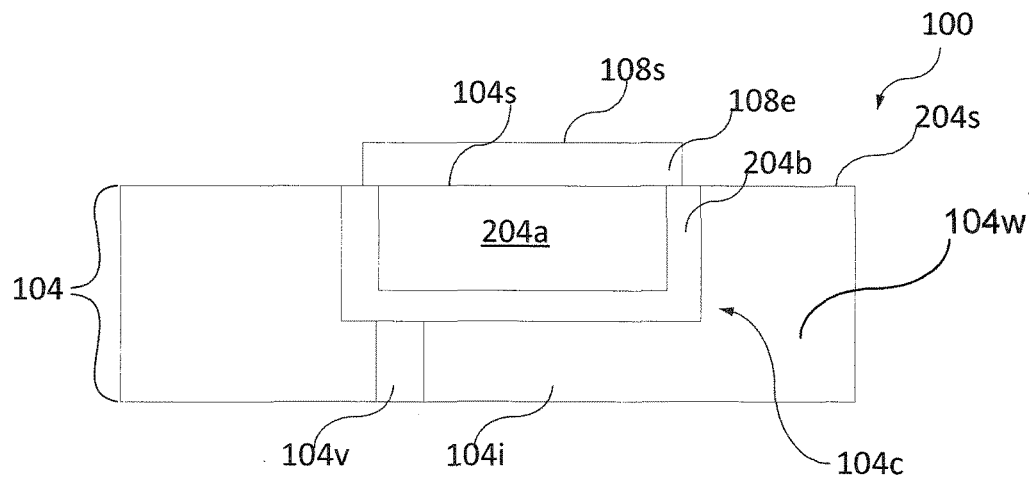
FIGS. 2A and 2B respectively show a metallization structure and an electrode structure being disposed over the metallization structure in a schematic cross sectional view or side view, according to various embodiments.

As illustrated in FIG. 2A, according to various embodiments, the metallization structure 104 may include a contact pad 104c (or a plurality of contact pads similar to the contact pad 104c shown in FIG. 2A). A plurality of contact pads 104c may also be referred to as contact pad structure 104c. The metallization structure 104 may include: a dielectric layer structure 104i; at least one contact pad 104c being in physical contact (e.g. mechanically coupled) with the dielectric layer structure 104i; the at least one contact pad 104c including a metal structure 204a and a liner structure 204b, wherein the liner structure 204b may be disposed between the metal structure 204a of the at least one contact pad 204 and the dielectric layer structure 104i, and wherein a surface 104s of the at least one contact pad 104c may be at least partially free from the liner structure 204b. Further, as already described, an electrode 108e (or a plurality of electrodes 108e) including an electrically conductive electroless deposited material may cover at least the surface 104s of the at least one contact pad 104c being at least partially free from the liner structure 204b. A plurality of electrodes 104c may also be referred to as electrode structure 108e. According to various embodiments, the electrode structure 108e may match the contact pad structure 104c. Further, according to various embodiments, the liner structure 204b and the electrode structure 108e may form a diffusion barrier for a material of the metal structure 204a of the contact pad structure 104c. Further, the liner structure 204b and the electrode structure 108e may form a diffusion barrier for oxygen and hydrogen, such that the metal structure 204a of the contact pad structure 104c may be protected. The electrode structure 108e may include a dense and smooth layer of silver and or gold serving as diffusion bather.

According to various embodiments, the dielectric layer structure 104i may include a dielectric material, as already described. The dielectric layer structure 104i may include a patterned dielectric layer 104i; therefore a deposited (e.g. spin coated) dielectric layer may be patterned using a patterning process, as described before. The patterned dielectric layer, e.g. the dielectric layer structure 104i, may include at least one of the following structure elements: one or more recesses, one or more voids, one or more through holes, and the like, to provide for example space for an electrically conductive wiring material to provide a wiring structure or a wiring. In other words, an electrical wiring 104w and the dielectric layer structure 104i may provide a metallization layer 104, wherein the electrical wiring may be supported by the dielectric layer structure 104i and/or the components of the electrical wiring (e.g. one or more metal lines, one or more vias, one or more contacts or contact pads, and the like) may be electrically isolated from each other to prevent undesired short-circuits. Further, as usual, the electrical wiring of the metallization layer 104 may include an electrically conductive material, as described before. According to various embodiments, forming the metallization layer 104 may include a copper etch technology and/or an aluminium etch technology. Further, the metallization layer 104 and/or forming the metallization layer 104 may include a so-called dual copper damascene technology, wherein the vias 104v and the metal lines 104w of the metallization layer 104 may be formed in a single process. It has to be noted, that the metallization layer 104 may also be formed in any other semiconductor metallization technology which may provide a contact pad 104c (or another contact structure) mechanically coupled to a dielectric layer 104i.

As illustrated in the figures, the contact pad 104c may be partially embedded into the dielectric layer structure 104i. According to various embodiments, the contact pad 104c may also include for example a plurality of different regions including different materials, e.g. different metals, metal alloys and the like. Further, a layer stack may be utilized to provide the contact pad 104c; the layer stack may include a plurality of layers including for example different materials. It goes without saying that the contact pad 104c may be electrically conductive and/or may include an electrically conductive material. According to various embodiments, the contact pad 104c may be electrically conductively connected to a metal line 104w or a wiring structure 104w and/or to a via 104v included in the metallization layer 104. Further, the contact pad 104c may be electrically connected to an additional metallization layer or to a plurality of additional metallization layers provided below the metallization layer 104, e.g. as a part of a multi-level metallization. Therefore, the contact pad 104c may be electrically conductively connected to an integrated circuit 110c or an integrated circuit structure 110c provide below the metallization layer 104 (see e.g. FIG. 5A to FIG. 5C).

According to various embodiments, the contact pad 104c may include a metal structure 204a; the metal structure may include a metal or a plurality of metals, a metal alloy, or any other electrically conductive material, e.g. doped silicon. Illustratively, the metal structure 204a may provide the core of the contact pad 104c. The metal structure 204a may be partially surrounded by a liner structure (a liner) 204b, wherein the liner structure 204b may be arranged between the metal structure 204a and the dielectric layer structure 104i of the metallization layer 104. As illustrated in FIG. 2A, at least one surface 104s of the contact pad 104 may be free of the liner structure 204b, since the least one surface 104s may not have a direct contact to the dielectric layer structure 104i. According to this, the metal structure 204a may provide an interface 104s for attaching (or growing or depositing) the electrode 108e over the contact pad 104c. Further, the metal structure 204a may provide an interface 104s for connecting to an additional wiring, e.g. electrically connecting the metallization structure 104 and/or the optoelectronic structure 108 and/or the electronic circuit 110c to a peripheral electronic component. According to various embodiments, the contact pad 104c may be arranged within the dielectric layer structure 104i such that the at least one surface 104s of the contact pad 104c may be substantially coextensive with the upper surface 204s of the dielectric layer structure 104i. Alternatively, the contact pad 104c may protrude from the dielectric layer structure 104i or may be flush-mounted (or recessed) within the dielectric layer structure 104i.

According to various embodiments, the optoelectronic structure 108 or the electrode 108e may be in direct contact with liner structure 204b of the contact pad 104c. Naturally, since the electrode 108e may be designed to conduct an electrical current, the electrode 108e may be electrically conductive and/or may include an electrically conductive material. Further, the liner structure 204b may include an electrically conductive material. Therefore, a direct contact of the electrode 108e and the liner structure 204b may provide an interface being able to reduce or prevent a diffusion or leakage of the material of the metal structure 204a of the contact pad 104c out of the contact pad 104c. Illustratively, the liner structure 204b and the electrode 108e may encapsulate the metal structure 204a of the contact pad 104c (e.g. the contact pad 104c including copper and/or aluminium) such that the material of the metal structure 204a of the contact pad 104c may not diffuse out of the contact pad 104c. This may enhance the reliability and the long term stability of the metallization structure 104, as well as the stability during process of the optoelectronic component 100.

FIG. 2A and the following figures respectively show a contact pad 104c and an optoelectronic component 100 including a metallization structure 104 in a schematic view, and it goes without saying, that the shape of at least one of: the contact pad 104c, the metal structure 204a, the liner structure 204b, the electrode 108e, and the dielectric layer structure 104i, may differ from the shape as shown in the figures, wherein the functionality of the metallization structure 104 as described herein may be preserved as long as the electrode 108e or the electrode structure 108e may be disposed in contact to the surface 104s of the contact pad 104c being free of liner material or free of the liner structure 204b. As shown in the following, additionally, a passivation layer structure may be disposed over the dielectric layer structure 104i.

Figure 2B:
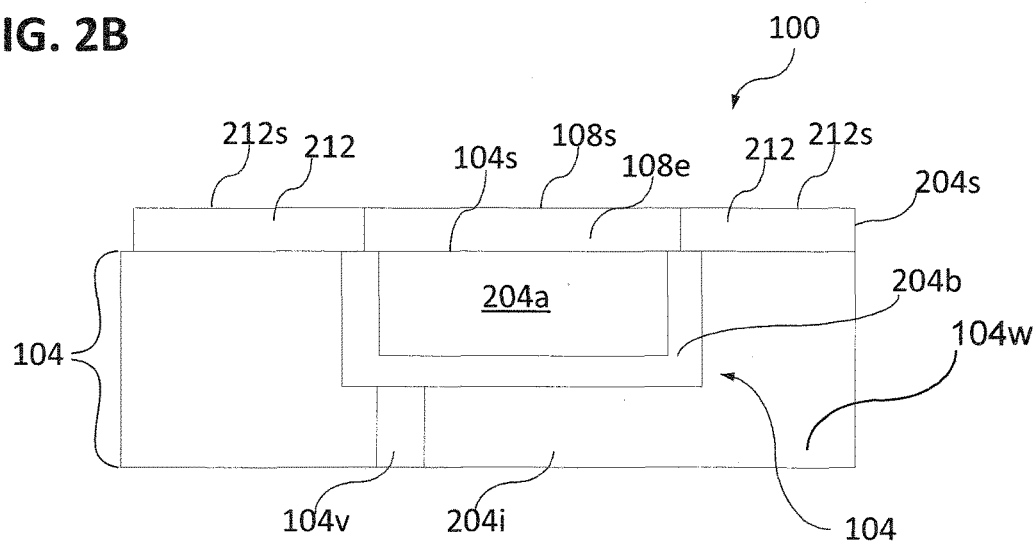

FIG. 2B illustrates a metallization structure 104 in a cross sectional view or in a side view, according to various embodiments, in analogy to the metallization structure 104, as shown in FIG. 2A, wherein a passivation layer structure 212 (e.g. an electrically insulating passivation layer structure) may be formed or disposed over the dielectric layer structure 104i or over a part of the exposed surface of the metallization structure 104. The passivation layer structure 212 may cover the dielectric layer structure 104i at least partially, or e.g. completely. The passivation layer structure 212 may be patterned such that the electrode structure 108e may be at least partially exposed, e.g. such that the upper surface 108s of the electrode structure 108e may be exposed to provide an electrically conductive connection between the optoelectronic layer stack 108k and the contact pad 104c or between the optoelectronic structure 108 and the electronic circuit 110c.

According to various embodiments, the contact pad 104c and the electrode structure 108e may be electrically conductively coupled with each other, wherein the electrode structure 108e may include a different material than the contact pad 104c or than the metal structure 204a of the contact pad 104c. Therefore, according to various embodiments, the electrode structure 108e may serve to provide at least one of: a protection for the contact pad 104c (e.g. a chemical protection or a physical protection), a contact surface 108s including another material than the upper surface 104s of the metal structure 204a of the contact pad 104c. According to various embodiments, the surface region of the electrode structure 108e including the exposed surface 108s may include for example silver or gold, wherein the surface region of the electrode structure 108e may provide a highly reflective electrode (e.g. having a reflectance larger than about 90% for light having a wavelength larger than about 500 nm or larger than about 600 nm).

Figure 8:
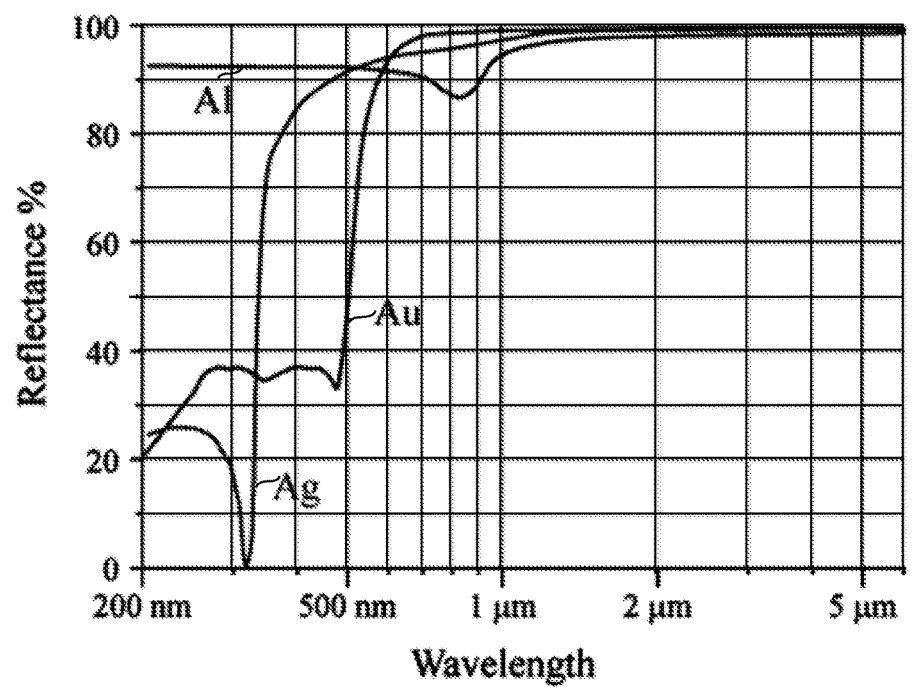
FIGS. 8 and 9 illustrate respectively the optical reflectance of different materials in dependence of the wavelength of the incident light, according to various embodiments.
Figure 9:
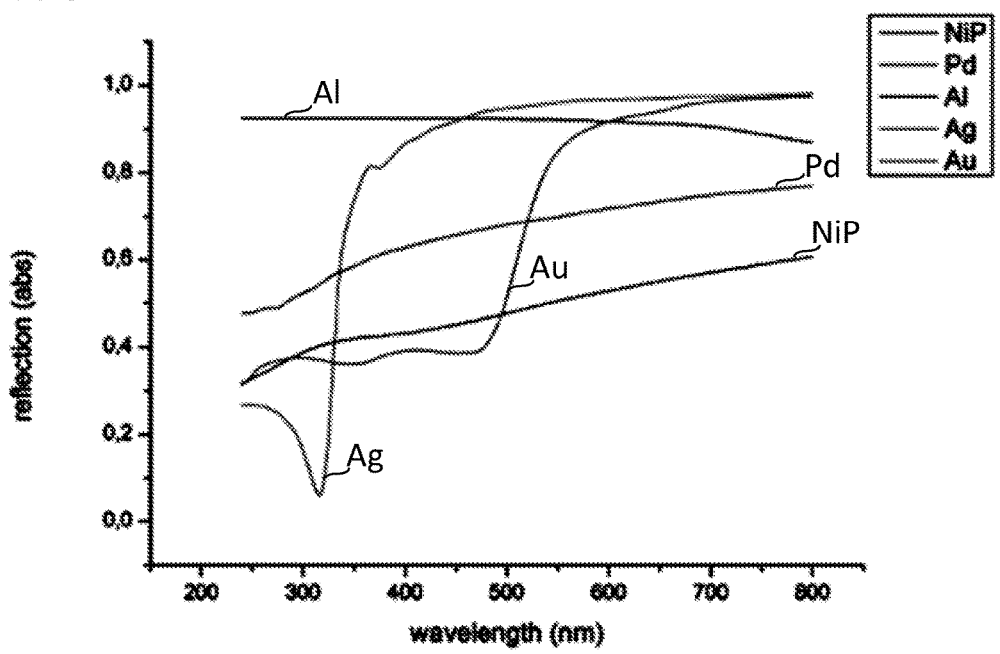

According to various embodiments, the optical properties of an electroless deposited gold or silver electrode structure 108e may be enhanced compared to an aluminum electrode or a copper electrode, as for example illustrated in FIGS. 8 and 9.

FIG. 3A shows a schematic view of an optoelectronic structure 108, wherein an optoelectronic layer stack 108k may be disposed over the electrode 108e forming the optoelectronic structure 108 (e.g. for providing the functionality of the optoelectronic device 100). The optoelectronic structure 108 including the optoelectronic layer stack 108k and the electrode 108e may be a disposed over the metallization structure 104 respectively in direct mechanical contact with each other. The optoelectronic layer stack 108k may be a part of an optoelectronic structure providing a light emitting device. Therefore, the electrode 108e, as described herein, may provide the bottom electrode of the light emitting device providing a first type of charge carriers and the layer 108b of the optoelectronic layer stack 108k may provide a second electrode providing a second type of charge carriers. According to various embodiments, the optoelectronic layer stack 108k may further include at least one electroluminescence layer 108a (or recombination layer 108a), wherein the first type of charge carriers provided by the electrode 108e and the second type of charge carriers provided by the top electrode 108b may recombine under emission of light. According to various embodiments, the electrode 108e and the optoelectronic layer stack 108k may be formed over a carrier 102, over a metallization structure 104, and/or over an electronic circuit 110c, e.g. a CMOS-structure, as already described.

According to various embodiments, the first type of charge carriers may be holes and the second type of charge carriers may be electrons. In this case, the electrode 108e may be an anode and the second electrode 108b may be a cathode. According to another embodiment, the first type of charge carriers may be electrons and the second type of charge carriers may be holes. In this case, the electrode 108e may be a cathode and the second electrode 108b may be an anode.

According to various embodiments, at least one of the electrodes 108e, 108b included in optoelectronic layer stack 108k may be transparent to light, wherein the other electrode of the electrodes 108e, 108b may be configured to be highly reflective to light (to be a mirror). According to various embodiments, the first electrode 108e may be configured as described herein, reflecting light generated within the optoelectronic structure 108. A second electrode may include for example an electrically conductive oxide (TCO) being substantially transparent to light, as already described.

According to various embodiments, the optoelectronic structure 108 may be a top emitting device. Therefore, the electrode 108e may be the bottom (mirror) electrode 108e and the second electrode 108b may provide the (transparent) top electrode. According to various embodiments, the second electrode 108b may be transparent to the light emitted from the electroluminescence layer 108a (or at least partially transparent to the specific wavelengths being emitted from the electroluminescence layer 108a), such that the optoelectronic component 100 may be configured as a top emitting light emitting diode.

According to various embodiments, the electroluminescence layer 108a may include or may be an inorganic light emitting layer, e.g. a semiconductor material including the desired band structure for emitting light while electrons and holes recombine within the electroluminescence layer 108a. According to various embodiments, the inorganic light emitting layer may include at least one material of the following group of materials: Gallium(III) phosphide (GaP), Aluminum gallium indium phosphide (AlGaInP), Aluminum gallium phosphide (AlGaP), Indium gallium nitride (InGaN), Gallium(III) nitride (GaN), Gallium arsenide (GaAs), Aluminum gallium arsenide (AlGaAs).

According to various embodiments, the electroluminescence layer 108a may include or may be an organic light emitting layer, e.g. an organic material including the desired band structure for emitting light while electrons and holes recombine within the electroluminescence layer 108a. According to various embodiments, the electroluminescence layer 108a may be arranged between the first electrode 108e and the second electrode 108b, as shown in FIG. 3A. According to various embodiments, the organic light emitting diode 108 may be configured as a top emitting organic light emitting diode. According to various embodiments, the electroluminescence layer 108a may be a layer stack including more than one electroluminescence layer. According to various embodiments, the electroluminescence layer stack may include at least to organic materials emitting light in a different color (or wavelength) range.

According to various embodiments, the organic light emitting layer 108a may include at least one material of the following group of materials: small molecules (e.g. N,N'-Bis(3-methylphenyl)-N,N'-bis(phenyl)-benzidin or thieno[3,4-c]pyrrole-4,6-dione (TPD), Nitrile Butadiene Polymer (NBP), Aluminum-tris(8-hydroxychinolin) (Alq3), Biphen) and/or polymers (e.g. Poly(p-phenylen-vinylen) PPV or PPV derivate, Poly[2-methoxy-5-(2'-ethylhexyloxy)-p-phenylene vinylene] (MEH-PPV), Poly(1,4-phenylen) (PPP), substituted PPP, Poly(9,9'-dioctlyfluorene)) and derivate and/or substitutions of said material.

According to various embodiments, the optoelectronic layer stack 108k shown in FIG. 3A may optionally include additional functional layers, as for example charge carrier injection layers 318a, 328a, charge carrier transport layers 318b, 328b, and/or charge carrier blocking layers 318c, 328c (so called blocking layers). These additional functional layers may enhance the properties of the OLED structure 108 or the OLED layer stack 108k.

According to various embodiments, in case the OLED layer stack 108k may be configured to provide a top emitting OLED, the electrode 108e may be the anode providing holes as charge carriers, the carrier injection layer 318a may be a hole injection layer 318a and the charge carrier transport layer 318b may be a hole transport layer 318b, wherein the charge carrier blocking layer 318c may be an electron blocking layer 318c. Further, the electrode 108b may be the cathode providing electrons as charge carriers, the carrier injection layer 328a may be an electron injection layer 328a and the charge carrier transport layer 328b may be an electron transport layer 328b, wherein the charge carrier blocking layer 328c may be a hole blocking layer 328c.

According to various embodiments, the hole transport layer 318b and the hole injection layer 318a may include at least one material of the following group of materials: NPB, TPD, or derivatives of NBP and TPD. According to various embodiments, electron transport layer 328b and the electron injection layer 328a may include at least one material of the following group of materials: FPF-BIm4, PFN-BIm4, Alg3, oxadiazole molecule (2-(4-biphenyl)-5-(4-tert-butylphenyl)-1,3,4-oxadiazole (PBD), 2,5-bis(4-naphthyl)-1,3,4-oxadiazole (BND), PBD in a poly(methyl methacrylate) (PMMA) matrix.

According to various embodiments, there may be a huge number of possible organic or metal organic materials which may be used as charge carrier injection layers 318a, 328a, charge carrier transport layers 318b, 328b, and/or charge carrier blocking layers 318c, 328c.

According to various embodiments, the optoelectronic layer stack 108k shown in FIG. 3A may include a capping layer 338 on top of the optoelectronic layer stack 108k, e.g. to protect the layer stack from environmental influences. Since the optoelectronic layer stack 108k may be a top emitting light emitting device, the capping layer 338 may be transparent to the light being emitted from the electroluminescence layer 108a.

According to various embodiments, the highly reflective metallic electrode 108e may provide the primary layer of the OLED structure 108k formed over the electrode 108e. Therefore, providing a high quality (e.g. a smooth and dense) electrode may enhance the functionality of the OLED layer stack 108k.

According to various embodiments, the organic materials formed over the electrode 108e may be applied by using a CVD process or a PVD process, or e.g. spin-coating, printing, and the like.

According to various embodiments, the carrier 102 of the optoelectronic component 100 may include a complementary metal-oxide-semiconductor (CMOS) structure providing an integrated circuit. According to various embodiments, the integrated circuit may enable the control of the OLED structure 108k formed over the integrated circuit.

Since the OLED structure 108 including the OLED layer stack 108k and the bottom electrode 108e may be formed over a metallization structure 104, the efficiency of the OLED device 100 may depend on the morphology of the grown functional layers of the layer stack 108k. The functional layers (318a, 318b, 318c, 108a, 328a, 328b, 328c, 108b, 338) of the layer stack 108k may include at least one of an additional metallic contact layer at the bottom of the OLED layer stack (not shown), a hole transport layer (providing the electrical transport of the holes from an anode to the electroluminescent layer), an electroluminescent layer (generating light due to recombination of electrons and holes within the electroluminescent layer), an electron transport layer (providing the electrical transport of the electrons from a cathode to the electroluminescent layer), an electron blocking layer (preventing and/or hindering electrons reaching the anode), a hole blocking layer (preventing and/or hindering holes reaching the cathode). According to various embodiments, the out-coupled intensity of the light provided by an OLED on a CMOS-structure may be directly proportional to the reflectance of the metallic contact electrode 108e at the bottom side of the OLED, the mirror electrode 108e. Besides the high reflectance, a very low surface roughness (e.g. smaller than 3 nm RMS) may be compulsory as for example a larger roughness may yield electrical field filaments in the hole transport layer (HTL) of the OLED and may cause subsequent degradation and/or an early fail of the optoelectronic component 100.

According to various embodiments, the electrode 108e may include at least one of the following layers or layer stacks: a gold layer, a silver layer, a nickel-phosphorous layer (NiP), and a palladium layer. According to various embodiments, the electrode 108e may a part of an OLED or OLED layer stack. According to various embodiments, the electrode 108e may a part of an OLED or OLED layer stack disposed on a metallization structure 104 of an integrated circuit (CMOS). According to various embodiments, the electrode 108e may be a highly reflective metallic contact layer e.g. for an organic light emitting diode. According to various embodiments, the electrode 108e may be an electrically conductive electrode, e.g. for an organic light emitting diode.

FIG. 3B shows a modified OLED layer stack 108k, including at least an anode 108 (electrode 108e), a hole transport layer 318c being p-type doped, an emissive layer (e.g. emitting light), an electron transport layer 328b being n-type doped, and a cathode 108b. According to another embodiment, the OLED layer stack 108k, may include at least a cathode 108 (electrode 108e), an electron transport layer 318b being n-type doped, an emissive layer 108a (e.g. emitting light), a hole transport layer 328b being p-type doped, and an anode 108b. According to various embodiments, the OLED layer stack 108k may further include an electron blocking layer and a hole blocking layer, (e.g. layer 318c and layer 328c as already described).

According to various embodiments, the p-type hole transport layer may include at least one material of the following group of materials: MTDATA, MeO-TPD, NPB, 2TNATA. According to various embodiments, the p-type hole transport layer may be doped by using at least one material of the following group of materials: $F_4TCNQ$, $WO_3$, $MoO_3$, and $V_2O_5$.

According to various embodiments, the n-type electron transport layer may include at least one material of the following group of materials: Bphen (Bphen 4,7-diphenyl-1,10-phenanthroline) and BCP (Bathocuproine). According to various embodiments, the n-type electron transport layer may be doped by using at least one material of the following group of materials: Li, Cs, and $Cs_2Co_2$.

According to various embodiments, the emissive layer 108a may include at least one material of the following group of materials:
IrPPy (Iridium, tris[2-(2-pyridinyl-κN)phenyl-κC]),
TCTA (Tris(4-carbazoyl-9-ylphenyl)amine), TCTA:IrPPy,
CBP (4,4'-N,N'-dicarbazole-biphenyl), CBP:IrPPy, TCTA: IrPPy/CBP:IrPPy, and
TCTA:IrPPy/TAZ:IrPPy, According to various embodiments, the hole blocking layer may include at least one material of the following group of materials: BCP, TPBi, Pphen.

According to various embodiments, the electron blocking layer may include at least one material of the following group of materials:
Spiro-TAD (2,2',7,7'-Tetrakis(diphenylamino)-9,9'-spirobifluorene),
TAPC (Di-[4-(N,N-ditolyl-amino)-phenyl]cyclohexane).

According to various embodiments, the electrode 108e or the optoelectronic layer stack 108k may be formed by using a standard layering process in semiconductor industry, e.g. at least one of a physical vapor deposition process and a chemical vapor deposition process.

According to various embodiments, at least the electrode 108e of the optoelectronic component 100 may be formed via an electroless deposition or electroless plating process.

According to various embodiments, the RMS roughness of the electrode 108e may be drastically reduced compared to commonly used approaches, e.g. the RMS roughness may be in the range from about 1 nm to about 3 nm, e.g. smaller than 3 nm, e.g. smaller than 2 nm, e.g. in the range of about 2 nm. Further, according to various embodiments, the electrode 108e may include a layer (e.g. including silver and/or gold) having a thicknesses of smaller than about 100 nm, e.g. in the range from about 3 nm to about 50 nm.

According to various embodiments, a layer of an organic semiconductor may be formed by using at least one of the following processes: physical vapor deposition, chemical vapor deposition, and spin-coating from a solution. Further the formed layer of an organic semiconductor may have polycrystalline morphology, nanocrystalline morphology, or an amorphous morphology. According to various embodiments, polycrystalline morphology and nanocrystalline morphology may include a plurality of crystallites, wherein the crystallites of the plurality of crystallites may have substantially a random orientation distribution. In other words, the crystallographic orientation of the crystallites may have a random spatial distribution.

FIG. 4A shows schematically a cross sectional view of an optoelectronic component 100 including an organic light emitting diode structure 408k (as described before, e.g. referring to the optoelectronic layer stack 108k) being arranged between the electrodes 108e, 108b, according to various embodiments. According to various embodiments, the optoelectronic component 100 may include at least one of the features and functionalities as described before referring to the optoelectronic structure 108, the metallization structure 104, the electronic circuit 110c, the optoelectronic layer stack 108k, and the carrier 102. According to various embodiments, forming the optoelectronic component 100 may include at least one of the features and functionalities as described herein at least referring to the optoelectronic structure 108, the metallization structure 104, the electronic circuit 110c, the optoelectronic layer stack 108k, and the carrier 102. According to various embodiments, the light emitting diode structure 408k may include at least the electroluminescence layer 108a, and additionally one or more functional layers of the optoelectronic layer stack 108k, as described before.

According to various embodiments, the optoelectronic component 100 may be a part of a display or a display device, e.g. an OLED display or an OLED display device. According to various embodiments, the optoelectronic component 100 may include for example an OLED structure 108 as described referring to FIG. 3A and FIG. 3B.

Figure 4B:
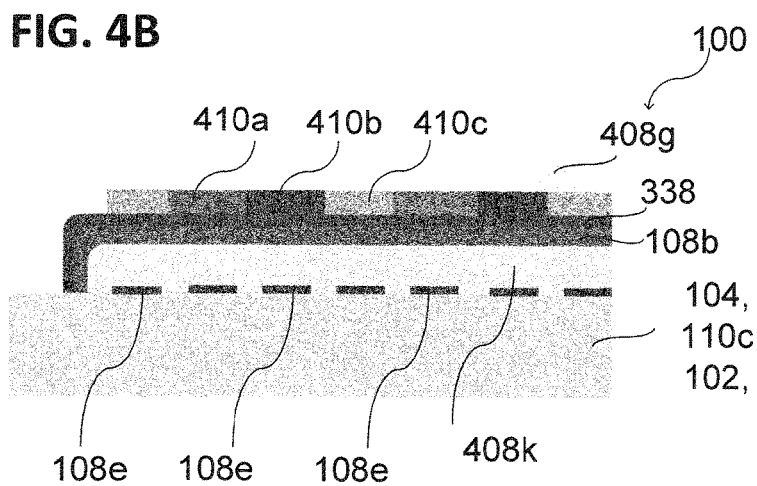

According to various embodiments, the optoelectronic component 100 may further include a capping layer 338, and a glass casing 408g. According to various embodiments, the top electrode 108b, the capping layer 338 and the glass casing 408g may transmit light, e.g. light being generated by the OLED structure 408k. According to various embodiments, as illustrated in FIG. 4B, the optoelectronic component 100 may include a color filter layer including for example regions 410a, 410b, 410c having different colors or filtering different wavelength ranges of the light generated by the OLED structure 408k. According to various embodiments, the color filter layer may be disposed between the capping layer 338 and the glass casing 408g. According to various embodiments, the electrode 108 may be a pixel anode. According to various embodiments, the optoelectronic component 100 may include a plurality of pixel anodes 108e.

Figure 4C:
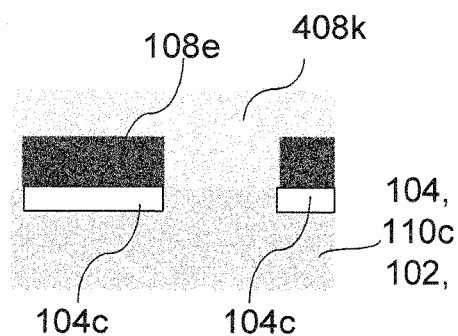
FIGS. 4C and 4D respectively show a detailed view of an optoelectronic component in a schematic cross sectional view or side view, according to various embodiments.
Figure 4D:
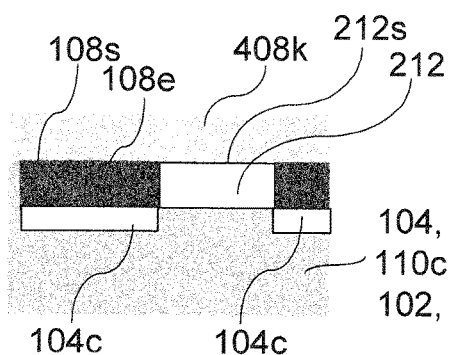

As shown in FIG. 4C, the electrode 108e may be disposed over the carrier 102, or over the integrated circuit 110c, or over the metallization structure 104. The electrodes 108e may be for example laterally surrounded by a part of the OLED structure 408k. However, since the electrode 108 may be very smooth, as already described, this may enable forming an electrode 108 as schematically shown in FIG. 4D, wherein the electrode 108 may be laterally surrounded with a passivation layer structure 212, e.g. the passivation layer structure 212 including a dielectric material, e.g. SiN. According to various embodiments, the upper surface 108s of the electrode 108e may be aligned with the upper surface 212s of the passivation layer structure 212. This may prevent the formation of kinks and edges in the OLED structure 408k being deposited over the electrode 108e. According to various embodiments, the surfaces of the electrode 108e and the passivation layer structure 212 may be for example planarised after being formed.

According to various embodiments, an optoelectronic component 100 (c.f. FIG. 5A) may include a carrier 102, an electronic circuit 110c, a metallization structure 104, and one or more electrodes (an electrode structure) 108e, as described before.

FIG. 5A shows an optoelectronic component 100 or a first part of an optoelectronic component 100 in a schematic cross sectional view, according to various embodiments. The optoelectronic component 100 may include at least an integrated circuit structure 110c being arranged at least one of over and in a carrier 102 (e.g. an integrated circuit in silicon technology being formed over a silicon wafer). Further, the optoelectronic component 100 may include a metallization structure 104 disposed over the integrated circuit structure 110c, wherein the metallization structure 104 may be electrically coupled to the integrated circuit structure 110c. The optoelectronic component 100 may include a dielectric layer structure 104i providing the metallization structure 104. Further, the metallization structure 104 may include at least one contact pad 104c being in physical contact with the dielectric layer structure 104i and being electrically coupled to the integrated circuit structure 110c; the at least one contact pad 104c may include a metal structure 204a and a liner structure 204b, wherein the liner structure 204b may be disposed between the metal structure 204a of the at least one contact pad 204 and the dielectric layer structure 104i, and wherein a surface of the at least one contact pad 104c may be at least partially free from the liner structure 204b.

According to various embodiments, the dielectric layer structure 104i may be a part of a multilevel metallization 104. Alternatively, a metallization structure 104 may include at least a top layer including a dielectric layer structure 104i and the contact pad 104c being at least partially embedded into the dielectric layer structure 104i, as described before.

According to various embodiments, the carrier 102 may include a semiconductor substrate, a wafer, or another type of carrier, as described before. The integrated circuit structure 110c may be arranged (formed) at least one of over and in the carrier 102, e.g. in any semiconductor technology. The integrated circuit structure 110c may include at least one of the following basic semiconductor structures: a MOS-structure (metal oxide semiconductor structure), an nMOS-structure (n-channel MOS-structure), a pMOS-structure (p-channel MOS-structure), a CMOS-structure (complementary metal oxide semiconductor structure). Further, according to various embodiments, the integrated circuit structure 110c may include or may be a part of (or may provide a part of) at least one of the following components: a chip, a memory chip, a die, a microprocessor, a microcontroller, a memory structure, a charge storage memory, a random access memory, a dynamic random access memory, a logic circuit, a sensor, a nanosensor, an integrated transceiver, a micro-mechanical device, a micro-electronic device, a nano-electronic device, an electrical circuit, a digital circuit, an analog circuit, and any other electronic device based on semiconductor technology, as for example a radio-frequency identification (RFID) chip and a chip card module.

Further, a memory structure (e.g. the memory structure included in the integrated circuit structure 110c) may include at least one of the following: a volatile memory, a DRAM (dynamic random access memory) or a non-volatile memory, a PROM (programmable read only memory), an EPROM (erasable PROM), an EEPROM (electrically erasable PROM), a flash memory, a floating gate memory, a charge trapping memory, an MRAM (magnetoresistive random access memory), a CBRAM (conductive bridge random access memory), and a PCRAM (phase change random access memory).

The integrated circuit structure 110c may include at least one electronic component of the following group of electronic components: a resistor, a capacitor, an inductor, a transistor (for example, a field effect transistor (FET) (e.g. a metal oxide semiconductor field effect transistor (MOSFET), a fin field effect transistor (FinFET), or a floating gate transistor), a power transistor, a bipolar transistor, an insulated gate bipolar transistor (IGBT)), a test structure, and any other electronic component based on semiconductor technology.

According to various embodiments, the metallization structure 104 may include a single level metallization or a multilevel metallization in any semiconductor metallization technology, for example copper etch based technology and/or aluminum etch based technology. The metallization structure 104 may include more than one (e.g. two, three, four, five, six, seven, eight, nine, ten, eleven, twelve, or even more than twelve) metallization layers 504a, 504b, 504c. A metallization layer 504a, 504b, 504c of the metallization structure 104 may include a dielectric material, e.g. an inter-layer dielectric, as already described, and an electrically conductive wiring structure including for example at least one of the following: one or more metal lines 513, one or more vias 512, and one or more landing structures 513 (landing pads) to electrically connect the respectively adjacent metallization layers or to electrically connect to the one or more contact pads 104c.

The dielectric layer structure 104i may include a layer stack including for example silicon oxide, silicon nitride, and/or silicon oxynitride. Further, the dielectric layer structure 104*i* may include an etch stop layer 504*i* (or one or more etch stop layers 504*i*), e.g. including silicon oxide, such that the material of the dielectric layer structure 104*i* may be etched selectively to the etch stop layer 504*i*. According to various embodiments, a silicon nitride layer 504*s* may be arranged between the single metallization layers 504*a*, 504*b*, 504*c*, wherein the nitride layer may be opened to electrically connect the metallization layers 504*a*, 504*b*, 504*c* with each other using vias 512.

According to various embodiments, the dielectric layer structure 104*i*, the contact pad 104*c*, the metal structure 204*a*, and/or the liner structure 204*b* may be configured as described before.

As illustrated in FIG. 5B, an optoelectronic structure 108 may be disposed over the metallization structure 104, as described before referring for example to FIG. 5A. The integrated circuit structure 110*c* may be the driver circuit for the optoelectronic structure 108.

As illustrated in FIG. 5C, the optoelectronic component 100 may further include a bond wiring structure 555, e.g. a bond wire or a plurality of bond wires, being contacted to the electrode structure 108*e* or to a bond pad 508. The bond pad 508 may include electroless deposited electrically conductive material, and may be formed for example in the same process as the electrodes 108*e* for the optoelectronic structure 108. The bond wiring structure 555 may be electrically conductively connected to the integrated circuit structure 110*c* via the bond pad 508, the at least one contact pad 104*c*, and the metallization structure 104. According to various embodiments, the optoelectronic component 100 may be electrically conductively coupled to an external device or an external component via the bond wiring structure 555. In other words, the optoelectronic component 100 may be a part of an electronic device or an optoelectronic device.

According to various embodiments, the bond pad 508 may include a material or a layer stack being formed via an electroless deposition process, wherein the material or the layer stack may be formed over the contact pad 104*c* including at least one of copper and aluminum. Referring to this, the material or the bond pad 508 or the layer stack providing the bond pad 508 may be in direct contact with the copper and/or aluminum of the contact pad 104*c*. Further, the material or the electrode 108*e* or the layer stack providing the electrode 108*e* may be in direct contact with the copper and/or aluminum of the contact pad 104*c*.

According to various embodiments, the electroless deposited electrode 108*e* may cover the liner 204*b* (e.g. including tantalum) and the metal structure 204*a* (e.g. including copper) to thereby protect the metal of the metal structure 204*a*.

According to various embodiments, alternatively, the metal structure 204*a* may protrude from the dielectric surrounding 104*i* or may be recessed into the dielectric surrounding 104*i*. Further, the metal structure 204*a* (e.g. including copper) and the liner 204*b* (e.g. including Ta, TiW, TaN, Ta) may protrude from the dielectric surrounding 104*i*, which may be formed by an over-etch process (e.g. plasma etching) and/or wet etching (e.g. including a fluorine-based etchant, e.g. DHF/BHF). Therefore the weak interface may be omitted.

Further, a recrystallization process may be performed to recrystallize the material of the electrode 108*e* (e.g. the silver), which may for example cause a hardening or a smoothening of the surface of the electrode 108*e*. The recrystallization process may include a heat treatment, e.g. at a temperature of larger than about 350° C. for a duration of about a few minutes. Further, the dielectric layer structure 104*i* may include SiON and/or SiN such that the final passivation may be closed.

FIG. 6 shows a schematic flow diagram of a method 600 for manufacturing an optoelectronic component 100, according to various embodiments. According to various embodiments, an optoelectronic component 100 may include a light emitting device, as described above. According to various embodiments, the method 600 for manufacturing an optoelectronic component 100 or an optoelectronic device may include: in 610, providing a metallization structure 104 disposed over a carrier 102, the metallization structure 104 including at least one contact pad 104*c*; and, in 620, forming an optoelectronic structure 108 over the metallization structure 104, the optoelectronic structure 108 including at least an electrode structure 108*e* being in direct contact with the at least one contact pad 104*c* of the metallization structure 104, wherein the electrode structure 108*e* including an electroless plated electrically conductive material.

Alternatively, FIG. 7 shows a schematic flow diagram of a method 700 for manufacturing an optoelectronic component 100, according to various embodiments. According to various embodiments, an optoelectronic component 100 may include a light emitting device, as described above. According to various embodiments, the method 600 for manufacturing an optoelectronic component 100 or an optoelectronic device may include: in 710, providing a metallization structure 104 disposed over a carrier 102, the metallization structure 104 including at least one contact pad 104*c*; in 720, performing an electroless plating process to form an electrode structure 108*e* over the metallization structure 104, the electrode structure 108*e* being electrically conductively connected to the at least one contact pad 104*c*, and, in 730, forming an optoelectronic layer stack 108*k* over the metallization structure 104 and over the electrode structure 108*e*, wherein the electrode structure 108*e* and the optoelectronic layer stack 108*k* provide a light emitting component (e.g. and LED or an OLED).

According to various embodiments, forming the electrode structure 108*e* may further include at least one process of the following group of processes: a layering process, a patterning process, polishing, a heat treatment, an etch process, a lithographic process.

According to various embodiments, forming an optoelectronic structure 108 or an optoelectronic layer stack 108*k* may be performed, as described before. According to various embodiments, forming optoelectronic structure 108 or an optoelectronic layer stack 108*k* may include forming a light emitting device or a light emitting structure over the metallization structure 104 or over the electrode 108*e*. According to various embodiments, forming an optoelectronic structure may include forming an LED or an OLED, as described herein.

According to various embodiments, the methods 600 and 700 as described may be adapted, modified and/or extended in such a way, that an optoelectronic component 100 and/or an optoelectronic structure 108 may be formed, as described before.

FIG. 8 and FIG. 9 illustrate respectively the reflectance (or reflectivity or reflection) of silver and gold compared to commonly used aluminum (or palladium or NiP) in dependence of the wavelength of the light, according to various embodiments. According to various embodiments, an electrode 108*e* including gold may be used for example for light emitting structures 108 emitting yellow, orange, and/or red light, e.g. light with a wavelength larger than about 600 nm.

In this color range of the light, the gold electrode 108e may work with a high efficiency, e.g. more than about 90% of the light may be reflected such that the gold electrode 108e may be a mirror. Further, using an electroless deposition, the gold electrode 108e may be deposited in a high quality (e.g. having properties supporting the reflection of light, e.g. a smooth surface and/or a dense microstructure).

According to various embodiments, an electrode 108e including silver may be used for example for light emitting structures 108 emitting cyan, green, yellow, orange, and/or red light, e.g. light with a wavelength larger than about 500 nm. In this color range of the light, the silver electrode 108e may work with a high efficiency, e.g. more than about 90% of the light may be reflected such that the silver electrode 108e may be a mirror. Further, using an electroless deposition, the silver electrode 108e may be deposited in a high quality (e.g. having properties supporting the reflection of light, e.g. a smooth surface and/or a dense microstructure).

As already described above, according to various embodiments, the electrode 108e may have a low RMS-roughness, or in other words, the surface of the electrode 108e or electrode structure 108e may have a low RMS-roughness. Further, the electrode 108e may provide a high reflectivity (reflectance), since the electrode 108e may include a silver and/or gold having a high reflectivity for visible light and/or a part of the visible light. Further, using silver or gold, the thickness of the electrode may be small compared to a commonly used aluminum electrode, due to the high reflectivity. According to various embodiments, the electrode 108e may have a thickness in the range of about 10 nm to about 50 nm, e.g. while having at the same time a low surface roughness in the range from about 1 nm to about 3 nm, or smaller than 1 nm.

According to various embodiments, due to the used materials and the electroless deposition, an electrode 108e for an optoelectronic structure 108 may be realized, wherein the electrode 108e may be provided with a small thickness. Therefore, suitable basis is provided for growing an OLED layer stack 108k over the electrode 108e having an enhance efficiency.

According to various embodiments, silver may be deposited on the anode (electrode) position of a metallization structure 104 and/or on a bond pad position of a metallization structure 104. According to various embodiments, the thickness of the silver anode 108e or the silver bond pad 508 may be in the range from about 10 nm to about 50 nm. In the case, the silver anode 108e or the silver bond pad 508 may not be surrounded by dielectric material 212, the step height on the surface of the metallization structure 104 may equal the thickness of the silver anode 108e or silver bond pad 508. In this case, no routing may be possible in this layer. According to various embodiments, the system passivation by be provided via the OLED-glass (a glass cover) 408g.

According to various embodiments, a passivation 212 may be disposed over the metallization structure 104, e.g. including silicon nitride, and may be opened in a region over the contact pad 104c to expose at least one surface 104s of the contact pad 104c. Further, the passivation 212 may be opened defining the anode area for forming the anode 108e. According to various embodiments, the electroless deposition of the silver forming the electrode 108e may be adapted to provide an electrode 108e with a thickness matching the thickness of the passivation 212, e.g. in the range from about 10 nm to about 150 nm, e.g. in the range from about 20 nm to about 50 nm. In this case, recesses (edges, kinks, steps, and the like) on the surface of the metallization structure 104 may be prevented; in other words, the electrode structure 108e over the metallization structure 104 may cause a minimal step-height.

In case a passivation 212 or a passivation layer 212 may be used, this layer may be used for routing. Further, the passivation 212 may be used to block the pad from silver deposition.

According to various embodiments, alternative electroless materials may be used in combination to achieve high reflectivity over a broad band or within a broad spectral window, for example Au (NiPAu or NiPPdAu) instead of pure Ag, or a combination of silver with Au (NiPAu or NiPPdAu), e.g. for OLED light emission larger than 600 nm, as described referring ton FIG. 8 and FIG. 9.

According to various embodiments, the electrode 108 may grow, via the electroless plating process, on the exposed surface 104s of the contact pad 104c.

According to various embodiments, an optoelectronic component may include: an electronic circuit structure including an electronic circuit and a metallization structure disposed over the electronic circuit, the metallization structure including one or more contact pads electrically connected to the electronic circuit; an optoelectronic structure disposed over the metallization structure, the optoelectronic structure including at least one electrode structure being in direct contact with the one or more contact pads, wherein the electrode structure may include an electroless plated electrically conductive material.

According to various embodiments, the electronic circuit may include a complementary metal oxide semiconductor circuit.

According to various embodiments, at least a part of the electronic circuit may be configured as a driver circuit for the optoelectronic structure.

According to various embodiments, the optoelectronic structure may be configured as an optoelectronic device selected from a group of optoelectronic devices, the group consisting of: a light emitting device; a photovoltaic cell; and an optoelectronic sensor.

According to various embodiments, the optoelectronic structure may include at least one light emitting diode.

According to various embodiments, the at least one light emitting diode may be configured as an organic light emitting diode.

According to various embodiments, the one or more contact pads of the metallization structure may include at least one of copper and aluminum.

According to various embodiments, the electrode structure may include at least one material of the following group of materials, the group consisting of: silver; gold; and copper.

According to various embodiments, the metallization structure may include at least one first contact pad being electrically conductively connected to a peripheral electronic component and at least one second contact pad being electrically conductively connected to the at least one electrode structure.

According to various embodiments, the electrode structure may include a plurality of electrodes, each electrode of the plurality of electrodes may be coupled to a corresponding contact pad of the one or more contact pads of the metallization structure.

According to various embodiments, the one or more contact pads of the metallization structure may be laterally embedded into a dielectric material, wherein at least a part of a surface of each of the one or more contact pads may be free of the dielectric material.

According to various embodiments, the contact pads of the plurality of contact pads may include a metal structure and a liner structure, the liner structure at least partially surrounding the metal structure to provide a diffusion barrier between the metal structure and the dielectric structure.

According to various embodiments, the optoelectronic component may further include: a passivation layer structure disposed over the metallization structure, wherein the electrode structure of the optoelectronic structure may be laterally embedded in the passivation layer structure.

According to various embodiments, an optoelectronic component may include: a metallization structure disposed over a carrier, the metallization structure including at least one contact pad; an optoelectronic structure disposed over the metallization structure, the optoelectronic structure including at least one electrode being in direct contact with the at least one contact pad of the metallization structure, wherein the electrode may include at least one of electroless plated gold and electroless plated silver.

According to various embodiments, a method for manufacturing an optoelectronic component may include: providing a metallization structure disposed over a carrier, the metallization structure including at least one contact pad; forming an optoelectronic structure over the metallization structure, the optoelectronic structure including at least an electrode structure being in direct contact with the at least one contact pad of the metallization structure, wherein the electrode structure may include an electroless plated electrically conductive material.

According to various embodiments, providing a metallization structure disposed over a carrier may include providing a metallization structure disposed over an electronic circuit, the electronic circuit being arranged at least one of over and in the carrier.

According to various embodiments, forming an optoelectronic structure may include forming a light emitting device.

According to various embodiments, forming an optoelectronic structure may include forming a light emitting diode.

According to various embodiments, forming an optoelectronic structure may include forming an organic light emitting diode.

According to various embodiments, the metallization structure may be formed in at least one of copper etch technology and aluminum etch technology such that the at least one contact pad of the metallization structure may include at least one of copper and aluminum.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An optoelectronic component comprising:
an electronic circuit structure comprising an electronic circuit and a metallization structure disposed over the electronic circuit, the metallization structure comprising one or more contact pads electrically connected to the electronic circuit;
an optoelectronic structure disposed over the metallization structure, the optoelectronic structure comprising a mirror bottom electrode being in direct contact with the one or more contact pads and an optoelectronic layer stack disposed over the mirror bottom electrode, the optoelectronic layer stack comprising a transparent top electrode and an electroluminescence layer disposed between the mirror bottom electrode and the transparent top electrode, wherein the mirror bottom electrode comprises an electroless plated electrically conductive material,
wherein the one or more contact pads comprise a first contact pad in direct contact with the mirror bottom electrode, and a second contact pad contacted to a bond pad disposed outside of the optoelectronic structure.

2. The optoelectronic component according to claim 1, wherein the electronic circuit comprises a complementary metal oxide semiconductor circuit.

3. The optoelectronic component according to claim 1, wherein at least a part of the electronic circuit is configured as a driver circuit for the optoelectronic structure.

4. The optoelectronic component according to claim 1, wherein the optoelectronic structure is configured as an optoelectronic device selected from a group of optoelectronic devices, the group consisting of:
a light emitting device;
a photovoltaic cell; and
an optoelectronic sensor.

5. The optoelectronic component according to claim 1, wherein the optoelectronic structure comprises at least one light emitting diode.

6. The optoelectronic component according to claim 5, wherein the at least one light emitting diode comprises at least one organic light emitting diode.

7. The optoelectronic component according to claim 1; wherein the one or more contact pads of the metallization structure comprising at least one of copper and aluminum.

8. The optoelectronic component according to claim 1; wherein the mirror bottom electrode comprises at least one material of the following group of materials, the group consisting of: silver; gold; and copper.

9. The optoelectronic component according to claim 1; wherein the metallization structure comprises at least one first contact pad being electrically conductively connected to a peripheral electronic component and at least one second contact pad being electrically conductively connected to the mirror bottom electrode.

10. The optoelectronic component according to claim 1; wherein the optoelectronic component comprises a plurality of mirror bottom electrodes, each mirror bottom electrode of the plurality of mirror bottom electrodes is coupled to a corresponding contact pad of the one or more contact pads of the metallization structure.

11. The optoelectronic component according to claim 1; wherein the one or more contact pads of the metallization structure are laterally embedded into a dielectric material, wherein at least a part of a surface of each of the one or more contact pads is free of the dielectric material.

12. The optoelectronic component according to claim 11; wherein the one or more contact pads comprise a metal structure and a liner structure, the liner structure at least partially surrounding the metal structure to provide a diffusion barrier between the metal structure and the dielectric structure.

13. The optoelectronic component according to claim 1, further comprising:
a passivation layer structure disposed over the metallization structure, wherein the mirror bottom electrode of the optoelectronic structure is laterally embedded in the passivation layer structure.

14. The optoelectronic component according to claim 1, wherein the metallization structure comprises a dielectric layer, wherein the first contact pad and the second contact pad are at least partially disposed in the dielectric layer.

15. The optoelectronic component according to claim 14, wherein a top surface of the first contact pad and/or a top surface of the second contact pad are substantially co-planar with a top surface of the dielectric layer facing in a direction towards the optoelectronic structure.

16. The optoelectronic component according to claim 1, wherein the bond pad comprises an electroless deposited electrically conductive material.

17. The optoelectronic component according to claim 1 wherein the bond pad is electrically coupled to an external device or an external component via a bond wiring structure.

18. The optoelectronic component according to claim 1, wherein the mirror bottom electrode has a reflectance larger than 90% for light having a wavelength larger than about 500 nm.

19. The optoelectronic component according to claim 1, wherein the mirror bottom electrode has a surface roughness (RMS) smaller than 3 nm.

20. An optoelectronic component comprising:
a metallization structure disposed over a carrier, the metallization structure comprising at least one contact pad;
an optoelectronic structure disposed over the metallization structure, the optoelectronic structure comprising a mirror bottom electrode being in direct contact with the at least one contact pad of the metallization structure, wherein the mirror bottom electrode comprises at least one of electroless plated gold and electroless plated silver, and
an optoelectronic layer stack disposed over the mirror bottom electrode, the optoelectronic layer stack comprising a transparent top electrode and an electroluminescence layer disposed between the mirror bottom electrode and the transparent top electrode,
wherein the at least one of electroless plated gold and electroless plated silver is in direct physical contact with the at least one contact pad of the metallization structure,
wherein the at least one contact pad comprises a first contact pad in direct contact with the mirror bottom electrode, and a second contact pad contacted to a bond pad disposed outside of the optoelectronic structure.

21. A method for manufacturing an optoelectronic component, the method comprising:
providing a metallization structure disposed over a carrier, the metallization structure comprising at least one contact pad;
forming an optoelectronic structure over the metallization structure, the optoelectronic structure comprising a mirror bottom electrode being in direct contact with the at least one contact pad of the metallization structure, wherein the mirror bottom electrode comprises an electroless plated electrically conductive material, and
wherein forming an optoelectronic structure comprises forming an optoelectronic layer stack disposed over the mirror bottom electrode, the optoelectronic layer stack comprising a transparent top electrode and an electroluminescence layer disposed between the mirror bottom electrode and the transparent top electrode, wherein the mirror bottom electrode comprises an electroless plated electrically conductive material,
wherein the electroless plated electrically conductive material is in direct physical contact with the at least one contact pad of the metallization structure,
wherein the at least one contact pad comprises a first contact pad in direct contact with the mirror bottom electrode, and a second contact pad contacted to a bond pad disposed outside of the optoelectronic structure.

22. The method according to claim 21, wherein providing a metallization structure disposed over a carrier comprises providing a metallization structure disposed over an electronic circuit, the electronic circuit being arranged at least one of over and in the carrier.

23. The method according to claim 21, wherein forming an optoelectronic structure comprises forming a light emitting device.

24. The method according to claim 21, wherein forming an optoelectronic structure comprises forming a light emitting diode.

25. The method according to claim 21, wherein forming an optoelectronic structure comprises forming an organic light emitting diode.

26. The method according to claim 21, wherein the metallization structure is formed in at least one of copper etch technology and aluminum etch technology such that the at least one contact pad of the metallization structure comprises at least one of copper and aluminum.

* * * * *